United States Patent
Diao et al.

(10) Patent No.: US 12,021,087 B2
(45) Date of Patent: Jun. 25, 2024

(54) DISPLAY SUBSTRATE, METHOD OF FORMING THE SAME, DISPLAY PANEL AND DISPLAY DEVICE INCLUDING SUB-CHANNEL PORTIONS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yongfu Diao, Beijing (CN); Wenkang Wang, Beijing (CN); Zhongliu Yang, Beijing (CN); Chenyu Chen, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 746 days.

(21) Appl. No.: 17/255,815

(22) PCT Filed: Oct. 22, 2019

(86) PCT No.: PCT/CN2019/112462
§ 371 (c)(1),
(2) Date: Dec. 23, 2020

(87) PCT Pub. No.: WO2021/077280
PCT Pub. Date: Apr. 29, 2021

(65) Prior Publication Data
US 2021/0366941 A1 Nov. 25, 2021

(51) Int. Cl.
*H01L 27/12* (2006.01)
*H10K 59/12* (2023.01)
(Continued)

(52) U.S. Cl.
CPC ........ *H01L 27/1222* (2013.01); *H01L 27/124* (2013.01); *H01L 27/1274* (2013.01); *H01L 27/0207* (2013.01); *H10K 59/1213* (2023.02)

(58) Field of Classification Search
CPC .............. H01L 27/1222; H01L 27/124; H01L 27/1274; H01L 27/0207; H10K 59/1213; G09G 3/3299
See application file for complete search history.

(56) References Cited

U.S. PATENT DOCUMENTS

2007/0278487 A1* 12/2007 Choung .............. H01L 27/1288
438/30
2014/0034923 A1 2/2014 Kim et al.
(Continued)

FOREIGN PATENT DOCUMENTS

CN 103578426 A 2/2014
CN 105518771 A 4/2016
(Continued)

OTHER PUBLICATIONS

International Search Report and Written Opinion for Application No. PCT/CN2019/112462, dated Jul. 20, 2020, 10 Pages.

*Primary Examiner* — Ida M Soward
(74) *Attorney, Agent, or Firm* — BROOKS KUSHMAN P.C.

(57) ABSTRACT

A display substrate, a method of forming a display substrate, a display panel and a display device are provided. The display substrate includes a thin film transistor array layer, where a semiconductor material layer pattern of a driving transistor in the thin film transistor array layer includes a first channel portion, and the first channel portion includes a first sub-channel portion and a second sub-channel portion; the semiconductor material layer pattern further includes a first conductive portion, an included angle between a straight line where a current conduction direction of the first sub-channel (Continued)

portion is located and a straight line where an extending direction of a data line in the thin film transistor array layer is located is a first included angle.

20 Claims, 14 Drawing Sheets

(51) Int. Cl.
   *H01L 27/02* (2006.01)
   *H10K 59/121* (2023.01)

(56) References Cited

U.S. PATENT DOCUMENTS

| | | | | |
|---|---|---|---|---|
| 2014/0332761 A1* | 11/2014 | Kim | ............ | G06F 1/00 |
| | | | | 430/5 |
| 2015/0069348 A1* | 3/2015 | Tae | ............ | H10K 59/1213 |
| | | | | 430/5 |
| 2016/0189611 A1 | 6/2016 | Jinta | | |
| 2018/0226459 A1* | 8/2018 | Bae | ............ | H10K 59/13 |
| 2018/0249046 A1* | 8/2018 | Son | ............ | G09G 3/3266 |
| 2018/0286314 A1 | 10/2018 | Cho et al. | | |
| 2019/0172856 A1 | 6/2019 | Tian | | |
| 2019/0304373 A1 | 10/2019 | Wang et al. | | |
| 2019/0385522 A1* | 12/2019 | Song | ............ | G09G 3/3291 |

FOREIGN PATENT DOCUMENTS

| | | | | |
|---|---|---|---|---|
| CN | 106505071 A | | 3/2017 | |
| CN | 107104112 A | | 8/2017 | |
| CN | 110349997 A | | 10/2019 | |
| KR | 20080055093 A | * | 6/2008 | ......... H01L 27/1222 |
| KR | 20170115150 A | * | 10/2017 | ........... H01L 27/124 |

* cited by examiner

DISPLAY SUBSTRATE, METHOD OF FORMING THE SAME, DISPLAY PANEL AND DISPLAY DEVICE INCLUDING SUB-CHANNEL PORTIONS

CROSS-REFERENCE TO RELATED APPLICATION

This application is the U.S. national phase of PCT Application No. PCT/CN2019/112462 Tiled on Oct. 22, 2019, which is incorporated herein by reference in its entirety.

TECHNICAL FIELD

The present disclosure relates to the field of display technologies, and in particular, to a display substrate, a method of forming the same, a display panel and a display device.

BACKGROUND

An Active-matrix organic light lining diode (AMOLED) display panel usually uses Low-Temperature poly-silicon as a semiconductor material layer, so that a Thin Film Transistor (TFT) device has high a carrier mobility, which is beneficial to improving the display effect of an organic light-emitting diode (OLED). When forming the semiconductor material layer of the thin film transistor by the Low-Temperature Poly-silicon (LTPS) back plate technology, the uniformity of the forded semiconductor material layer also effects the display effect of the OLED.

SUMMARY

In a first aspect, a display substrate is provided in an embodiment of the present disclosure, including a base substrate and a thin film transistor arranged tan the base substrate, where
a semiconductor material layer pattern of a driving transistor in the thin film transistor array layer includes a first channel portion, and the first channel portion includes a first sub-channel portion and a second sub-channel portion;
the semiconductor material layer pattern further includes a first conductive portion connected to the first stab-channel portion;
an included angle between a straight line where a current conduction direction of the first sub-channel portion is located and a straight line where an extending direction of a data line in the thin film transistor array layer is located is a first included angle;
an included angle between a straight line where a current conduction direction of the second sub-channel portion is located and the straight line where the extending direction of the data line is located is a second included angle;
an included angle between a straight line where a current conduction direction of the first conductive portion is located and the straight line where the extending direction of the data line is located is a third included angle;
the first included angle is smaller than the second included angle, and the third included angle is smaller than the second included angle.
Optionally, a length of the first sub-channel portion is greater than a length of the second sub-channel portion.
Optionally, the first channel portion is a portion where the semiconductor material layer pattern of the driving transistor overlaps with a gate electrode of the driving transistor.
Optionally, the first channel portion is a zigzag channel portion.
Optionally, the current conduction direction of the first sub-channel portion is substantially parallel to the extending direction of the data line, and the current conduction direction of the second sub-channel portion is substantially perpendicular to the extending direction of the data line.
Optionally, a ratio of a length of the first sub-channel portion to a total length of the first channel portion is greater than 0.5.
Optionally, the semiconductor material layer pattern of the driving transistor further includes a second conductive portion, the first conductive portion and the second conductive portion are arranged on opposite sides of the first channel portion;
the first sub-channel portion includes a first vertical channel portion, a second vertical channel portion and a third vertical channel portion, the second sub-channel portion includes a first horizontal channel portion and a second horizontal channel portion, where
a first end of the first vertical channel portion is connected to the first conductive portion, a second end of the first vertical channel portion is connected to a first end of the first horizontal channel portion, a second end of the first horizontal channel portion is connected to a first end of the second vertical channel portion, a second end of the second vertical channel portion is connected to a first end of the second horizontal channel portion, a second end of the second horizontal channel portion is connected to a first end of the third vertical Channel portion, and a second end of the third vertical channel portion is connected to the second conductive portion.
Optionally, the semiconductor material layer pattern further includes :a first horizontal conductive portion and a first vertical conductive portion;
a first end of the first conductive portion is connected to the first end of the first vertical channel portion;
a first end of the first horizontal conductive portion is connected to a second end of the first conductive portion, and a second end of the first horizontal conductive portion is connected to the first vertical conductive portion.
Optionally, a length of the first vertical conductive portion is greater than a length of the first horizontal conductive portion, the length of the first vertical conductive portion is greater than a length of the first conductive portion.
Optionally, the semiconductor material layer pattern further includes a second horizontal conductive portion and a second vertical conductive portion:
a first end of the second conductive portion is connected to the second end of the third vertical channel portion;
a first end of the second horizontal conductive portion is connected to a sect rid end of the second conductive portion, and a second end of the second horizontal conductive portion is connected to the second vertical conductive portion.
Optionally, a length of the second vertical conductive portion is greater than a length of the second horizontal conductive portion, the length of the second vertical conductive portion is greater than a length of the second conductive portion.
Optionally, an area of an orthographic projection of the second conductive portion on the substrate is greater than an area of an orthographic projection of the first conductive portion on the substrate.
Optionally, the thin film transistor array layer includes a first gate metal layer and a semiconductor material layer, the first gate metal layer includes a gate electrode of the driving transistor, a gate line at a first side of the gate electrode and a light-emitting control signal line at a second side of the gate electrode;

an orthographic projection of the gate line on the substrate, an orthographic projection of the light-emitting control signal line on the substrate and an orthographic projection of the semiconductor .material layer on the substrate forms a rectangular region;

a length of the rectangular area is greater than a width of the rectangular area;

the width of the rectangular region is the width of the rectangular region along a direction of the gate line, and the length of the rectangular region is the length of the rectangular region along a direction perpendicular to the gate line.

Optionally, the thin film transistor array layer includes a fight-emitting control transistor;

a channel portion of a semiconductor material layer pattern of the light-emitting control transistor, the second conductive portion, the first channel portion and the first conductive portion are sequentially arranged along a longitudinal direction.

Optionally, the thin film transistor array layer includes a first light-emitting control transistor and a second light-emitting control transistor;

a semiconductor material layer pattern of the first light-emitting, control transistor includes a second channel portion, the semiconductor material layer pattern of the second light-emitting control transistor includes a third channel portion:

the second channel portion, the second conductive portion, the first channel portion and the first conductive portion are sequentially arranged along the longitudinal direction;

the third channel portion, the second conductive portion, the first channel portion and the first conductive portion are sequentially arranged in a longitudinal direction.

In a second aspect, a method of forming the display substrate hereinabove is further provided in an embodiment of the present disclosure, including:

forming an amorphous silicon layer on a base substrate;

performing a laser annealing treatment on the amorphous silicon layer to convert the amorphous silicon layer into a polycrystalline silicon layer;

performing a patterning process on the polycrystalline silicon layer to form a semiconductor material layer pattern, arranging a first channel portion of a semiconductor material layer pattern of a driving transistor in a thin film transistor array layer to includes a first sub-channel portion and a second sub-channel portion, arranging a first conductive portion of the semiconductor material layer pattern to be connected to the first sub-channel portion;

an included angle between a straight line where a current conduction direction of the first sub-channel portion is located and a straight line where an extending direction of a data line in the thin film transistor array layer is located is a first included angle;

an included angle between a straight line where a current conduction direction of the second sub-channel portion is located and the straight line where the extending direction of the data line is located is a second included angle;

an included angle between a straight line where a current conduction direction of the first conductive portion is located and the straight line where the extending direction of the data line is located is a third included angle;

the first included angle is smaller than the second included angle, and the third included angle is smaller than the second included angle.

Optionally, where a length of the first sub-channel portion is greater than a length of the second sub-channel portion.

Optionally, a straight line along which a laser scanning direction is located is substantially parallel to the straight line where the current conduction direction of the first sub-channel portion is located.

In a third aspect, a display panel including the display substrate hereinabove is further provided in an embodiment of the present disclosure, In a fourth aspect, a display device including the display panel hereinabove further provided in an embodiment of the present disclosure,

DETAILED DESCRIPTION

Figure 1:
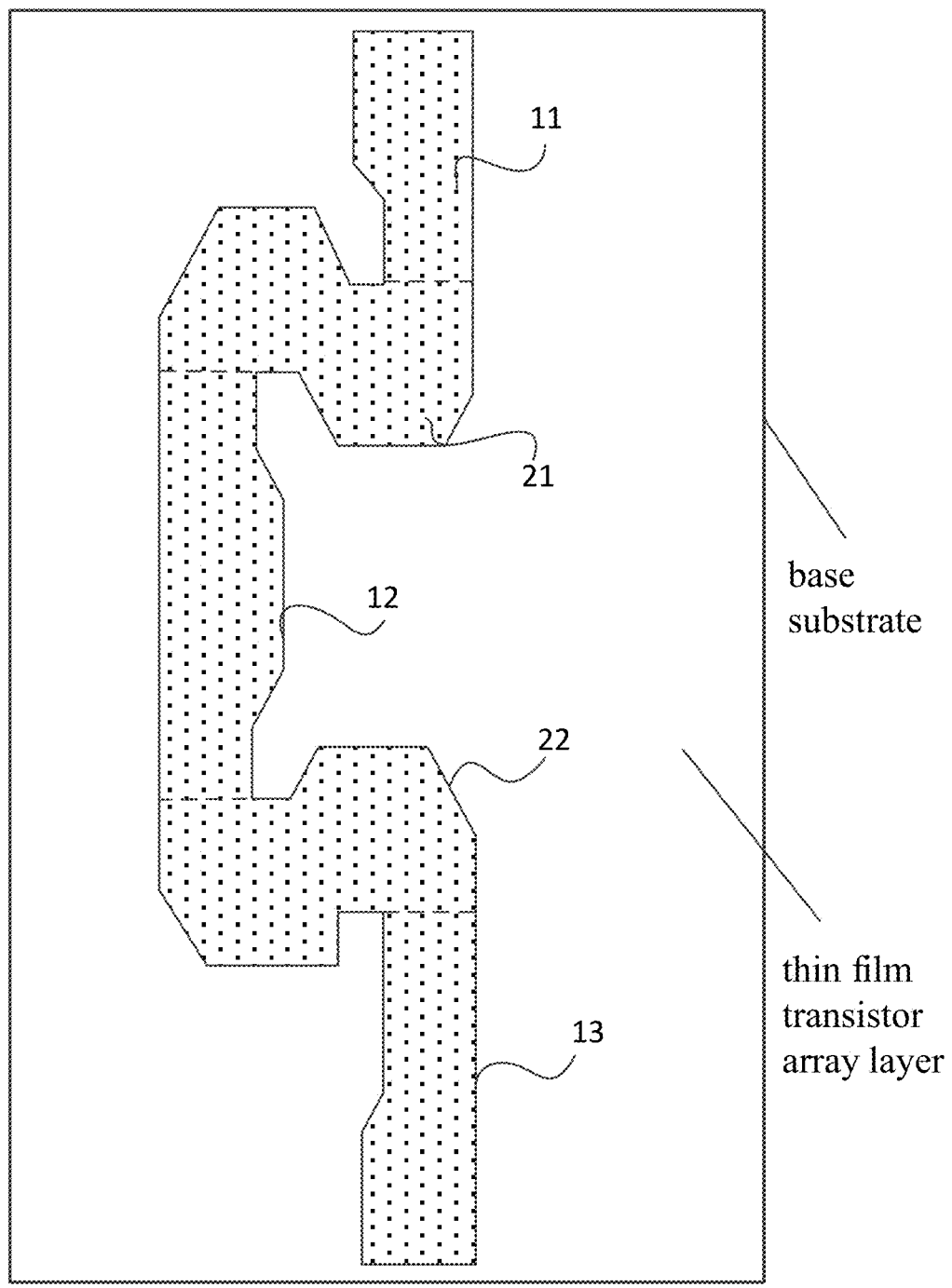
FIG. 1 is a schematic view of a first, channel portion in a semiconductor material layer pattern of a driving transistor in a display substrate according to at least one embodiment of the disclosure.

The technical solutions in the embodiments of the present disclosure will he described clearly and completely with reference to the drawings in the embodiments of the present disclosure, and it is obvious that the embodiments described are only some embodiments of the present disclosure, rather than all embodiments. All other embodiments, which can be derived by a person skilled in the art from the embodiments disclosed herein without making any creative work, shall fall within the scope of the present disclosure.

The transistors used in all embodiments of the present disclosure may be transistors, thin film transistors, or field effect transistors or other devices with the satire characteristics. In the embodiments of the present disclosure, to distinguish two transistors of a transistor except for a control transistor, one transistor is referred to as a first transistor, and the other transistor is referred to as a second transistor.

In practical operation, when the transistor is a triode, the control electrode may be a base electrode, the first electrode may be a collector electrode, and the second electrode may be an emitter electrode; alternatively the control electrode may be a base electrode, the first electrode may be an emitter electrode, and the second electrode may be a collector electrode.

In practical operation, when the transistor is a thin film transistor or a field effect transistor, the control electrode may be a gate electrode, the first electrode may be a drain electrode, and the second electrode may be a source electrode; alternatively, the control electrode may be a gate electrode, the first electrode may be a source electrode, and the second electrode may be a drain electrode.

The display substrate includes a base substrate and a thin film transistor array layer arranged on the base substrate, where a semiconductor material layer pattern of a driving transistor in the thin film transistor array layer includes a first channel portion, and the first channel portion includes a first sub-channel portion and a second sub-channel portion;

the semiconductor material layer pattern further includes a first conductive portion connected to the first sub-channel portion;

an included angle between a straight line where a current conduction direction of the first sub-channel portion is located and a straight line where an extending direction of a data line in the thin film transistor array layer is located is a first included angle;

an included angle between a straight line where a current conduction direction of the second sub-channel portion is located and the straight line where the extending direction of the data line is located is a second included angle;

an included angle between a straight line where a current conduction direction of the first conductive portion is located and the straight line where the extending direction of the data line is located is a third included angle;

the first included angle is smaller than the second included angle, and the third included angle is smaller than the second included angle.

In at least one embodiment of the present disclosure, the current is conducted from the first conductive portion, and a conducting direction of the current from the first conductive portion to the first sub-channel portion may tend to be the same as an extending direction of the data line, which is beneficial to make channel crystal grains of the driving transistor in the current conduction direction more orderly after ELA (Excimer Laser Annealing) is performed on the amorphous silicon layer when forming a polysilicon active layer of the thin film transistor.

In at least one embodiment of the present disclosure, the included angle is an acute angle formed by two straight lines intersecting each other; when the two straight lines are parallel, the included angle between the two straight lines is 0 degree.

According to the display substrate in at least one embodiment of the disclosure, the channel direction of the driving transistor is adjusted, so that the current conduction direction of the first channel portion in the semiconductor material layer pattern of the driving transistor tends to be parallel to the extending direction of the data line, and the current conduction direction tends to be parallel to the laser scanning direction, so that the channel crystal grains of the driving transistor are arranged in a relatively orderly manner in the current conduction direction, thereby improving the quality of the display substrate.

In at least one embodiment of the present disclosure, the current conduction direction of the first sub-channel portion refers to: a conduction direction of current carriers in the first sub-channel portion when the driving transistor is turned on;

the current conduction direction of the second sub-channel portion refers to a conduction direction of current carriers in the second sub-channel portion when the driving transistor is turned on.

In at least one embodiment of the present disclosure, an extending direction of the data line is a length direction of the data line, but is not limited thereto.

Optionally, the length of the first sub-channel portion is greater than the length of the second sub-channel portion, so that the first channel portion of the semiconductor material layer pattern of the driving transistor can be relatively orderly arranged in the current conduction direction, thereby improving the field mobility and the output current characteristics of the driving current region.

As shown in FIG. 1, in at least one embodiment, a first channel portion in a semiconductor material layer pattern of a driving transistor includes a first sub-channel portion and a second sub-channel portion:

the first sub-channel portion includes a first vertical channel portion 11, a second vertical channel portion 12, and a third vertical channel portion 13;

the second sub-channel portion includes a first horizontal channel portion 21 and a second horizontal channel portion 22;

the length of the first sub-channel portion is equal to the sum of the length of the first vertical channel portion 11, the length of the second vertical channel portion 12 and the length of the third vertical channel portion 13;

the length of the second sub-channel portion is equal to the sum of the length of the first horizontal channel portion 21 and the length of the second horizontal channel portion 22.

Figure 2:
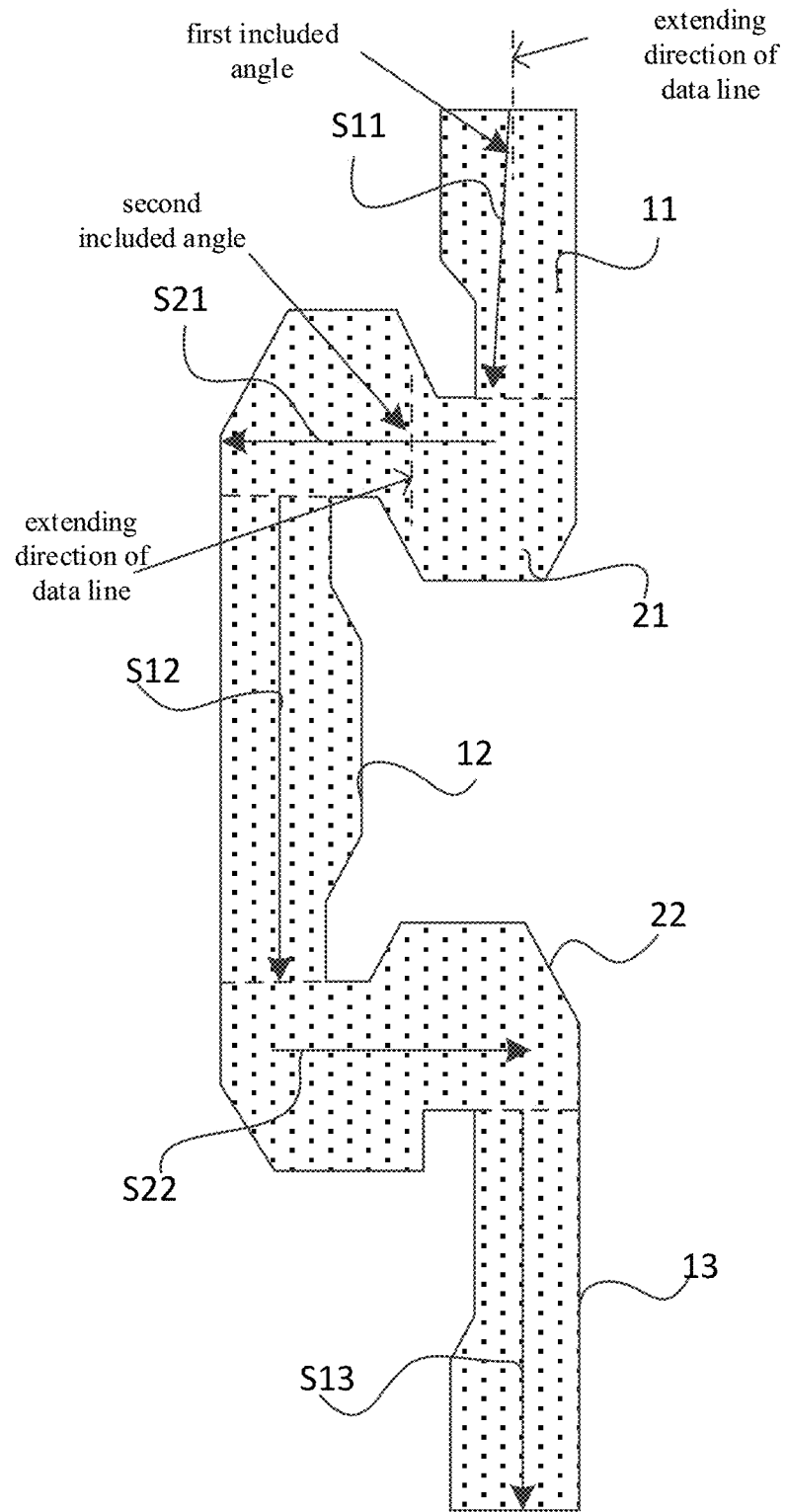
FIG. 2 is a schematic view of current conduction directions of sub-channel portions of a first channel portion in the semiconductor material layer pattern of the driving transistor of FIG. 1.

As shown in FIG. 2, the current conduction direction of the first vertical channel portion 11 is a first direction S11, the current conduction direction of the second vertical channel portion 12 is a second direction S12, and the current conduction direction of the third vertical channel portion 13 is a third direction S13;

the current conduction direction of the first horizontal channel portion 21 is a fourth direction S21, and the current conduction direction of the second horizontal channel portion 22 is a fifth direction S22.

In the related art, when forming as polysilicon active layer of a thin film transistor, an amorphous silicon layer is generally subjected to ELA (Excimer Laser Annealing) so that the amorphous silicon layer is converted into a polysilicon active layer.

In at least one embodiment of the present disclosure, an extending direction of the data line may be the same as a laser scanning direction, but is not limited thereto. The laser scanning direction may be a scanning direction of the excimer laser beam, but is not limited thereto.

In the related art, the relationship between the excimer laser beam scanning direction and the current conduction direction of the channel of the drive transistor is generally not considered at the time of design. The inventors found that in the forming process of a semiconductor material layer, such as a low-temperature polysilicon semiconductor material layer, the amorphous silicon is converted into polysilicon after the amorphous silicon is subjected to a laser scanning, the converted crystal grains have a certain degree of crystal grain ordering, and the flowing current carriers may be affected by the crystal grain ordering, and then the display is affected as a result. Based on this, the display substrate according to at least one embodiment of the present disclosure adjusts the channel direction of the driving transistor, so that the current conduction direction of the first channel portion in the semiconductor material layer pattern of the driving transistor tends to be parallel to the extending direction of the data line, and thus the current conduction direction tends to be parallel to the laser scanning direction, so that the channel grains of the driving transistor are arranged relatively orderly in the current conduction direction, thereby improving the field mobility of the driving circuit region, reducing the visual defect of Mura (brightness non-uniformity) display, and improving the quality and yield of the display substrate.

In at least one embodiment of the present disclosure, the first channel portion in the semiconductor material layer pattern of the driving transistor is designed to be a zigzag type, such as a zigzag type, an S type, a W type, or a Z type. In addition, in at least one embodiment of the present disclosure, by adjusting the lengths and the current conduction directions of the sub-channel portions in the first channel portion in the semiconductor material layer pattern of the driving transistor, the current conduction direction of the first channel portion in the semiconductor material layer pattern of the driving transistor is parallel to the ELA laser scanning direction as much as possible, and the first channel portion includes a portion that is not completely parallel to the ELA laser scanning direction, so that the crystal grain of the first channel portion of the semiconductor material layer pattern of the driving, transistor in the current conduction direction is arranged relatively orderly, and a certain channel length can he ensured, thereby improving the field mobility and the output current characteristics of the driving, current region.

In at least one embodiment of the present disclosure, the gate of the driving transistor may be reused as an electrode plate of a storage capacitor in the driving circuit, hut is not limited thereto.

In a specific implementation, the first channel portion is a portion where the semiconductor material layer pattern of the driving transistor overlaps with a gate electrode of the driving transistor.

In a specific implementation, an orthographic projection of the first channel portion of the semiconductor material layer pattern of die driving transistor in the thin film transistor array layer on the substrate is within the orthographic projection of the gate of the driving transistor on the substrate.

Figure 3:
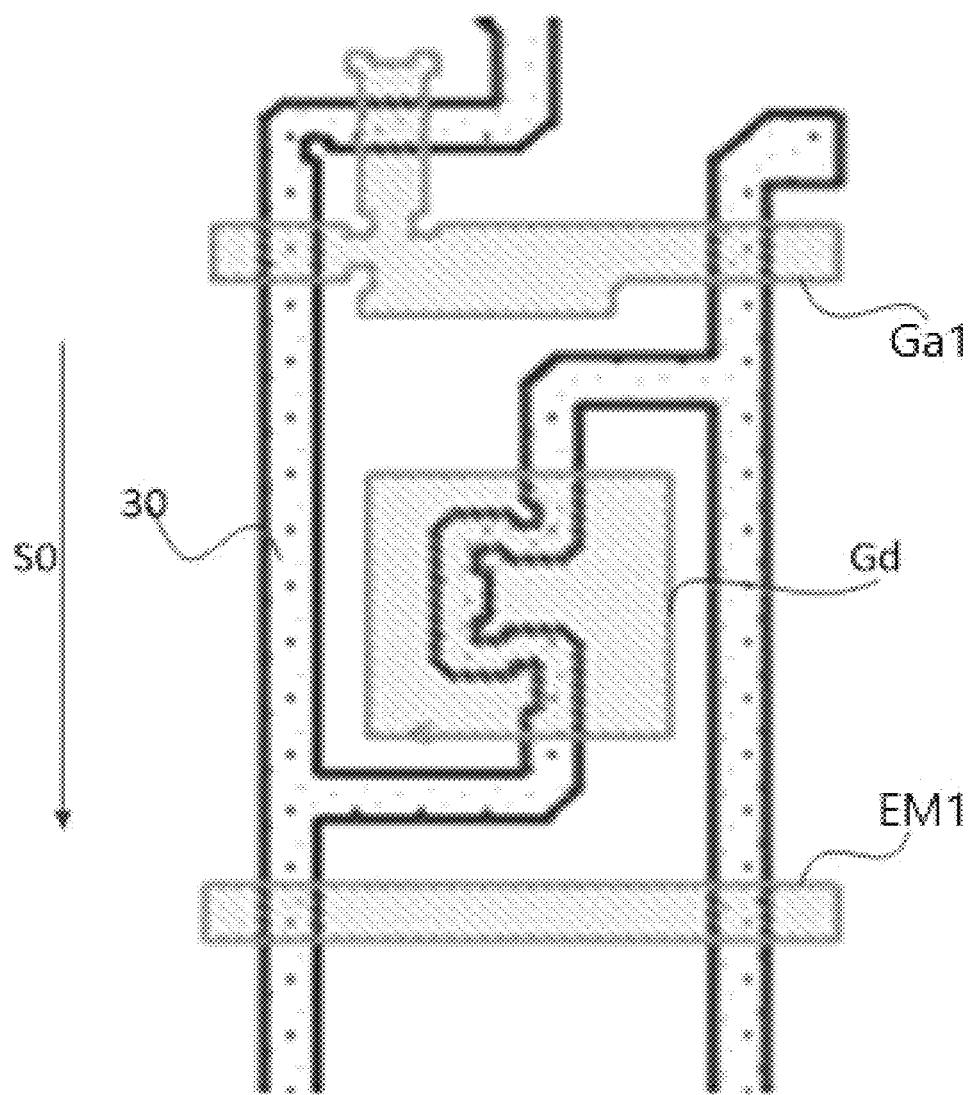
FIG. 3 is a schematic view illustrating. orthographic projections of a semiconductor material layer pattern and a gate metal pattern on a substrate in a display substrate, according to at least one embodiment of disclosure.

As shown in FIG. 3, Gd represents a gate of the driving transistor, and 30 represents a semiconductor material layer pattern; an orthographic projection of the first channel portion of the semiconductor material layer pattern 30 on the base substrate is within an orthographic projection of Gd on the base substrate;

in FIG. 3, reference numeral Ga1 represents a first gate line, and reference numeral EM1 represents a first control signal line;

in FIG. 3, reference numeral S0 represents a laser scanning direction;

As can be seen from FIG. 3, the orthographic projection of the first channel portion in the semiconductor material layer pattern of the driving transistor on the base substrate is within the orthographic projection of the gate electrode of the driving transistor on the base substrate.

The length of a rectangular area enclosed by the orthographic projection of the first gate line Ga1 on the substrate, the orthographic projection of the first light-emitting control signal line EM1 on the substrate and the semiconductor material layer pattern 30 is larger than the width of the rectangular area;

the width of the rectangular region is the width of the rectangular region along the direction of the first gate line, and the length of the rectangular region is the length of the rectangular region along the direction perpendicular to the first gate line.

In at least one embodiment of the present disclosure, the thin film transistor array layer may include a first gate metal layer and a semiconductor material layer, the first gate metal layer includes the gate electrode of the driving transistor, a gate line on a first side of the gate electrode of the driving transistor, and a light-emitting control signal line on a second side of the driving transistor;

the orthographic projection of the gate line on the substrate, the orthographic projection of the light-emitting control signal lino on the substrate and the orthographic projection of the semiconductor material layer on the substrate form a rectangular region;

the length of the rectangular area is greater than the width or the rectangular area;

the width of the rectangular region is the width of the rectangular region along the direction of the gate line, and the length of the rectangular region is the length of the rectangular region along the direction perpendicular to the gate line.

In at least one embodiment of the present disclosure, the first channel portion may be a zigzag channel portion, but is not limited thereto.

Optionally, a current conduction direction of the first sub-channel portion is substantially parallel to an extending direction of the data line, and a current conduction direction of the second sub-channel portion is substantially perpendicular to the extending direction of the data line.

In at least one embodiment of the present disclosure, a current conduction direction of the first sub-channel portion being substantially parallel to an extending direction of the data line may refer to: an included angle between a straight line of the current conduction direction of the first sub-channel portion and a straight line of the extending direction of the data line is greater than or equal to 0 degree and less than or equal to 20 degrees, but is not limited thereto. An included angle between a straight line of a current conduction direction of the first sub-channel portion and a straight line of an extending direction of the data line may be: an acute angle formed by intersection of a straight line of the current conduction direction of the first sub-channel portion and a straight line of the extending direction of the data line, but is not limited thereto.

In at least one embodiment of the present disclosure, an included angle between a straight line of the current conduction direction of the first sub-channel portion and a straight line of the extending direction of the data line may be equal to 0 degree, 5 degrees, 10 degrees, 15 degrees, or 20 degrees, but is not limited thereto.

In at least one embodiment of the present disclosure, a current conduction direction of the second sub-channel portion and an extending direction of the data line being substantially perpendicular to each other may refer to: an included angle between a straight line of the current conduction direction of the second sub-channel portion and a straight line of the extending direction of the data line is greater than or equal to 70 degrees and less than or equal to 110 degrees, but is not limited thereto.

In at least one embodiment of the present disclosure, an included angle between a straight line of the current conduction direction of the second sub-channel portion and a straight line of the extending direction of the data line may be equal to, but not limited to, 70 degrees, 80 degrees, 90 degrees, 100 degrees, or 110 degrees, but is not limited thereto.

In at least one embodiment shown in FIG. 3, the extending direction of the data line may be parallel to the laser scanning direction S0, i.e. the extending direction of the data line is a vertical direction, but is not limited thereto.

In actual operation, the extending direction of the data line and the laser scanning direction may be parallel or substantially parallel, and the included angle between the extending direction of the data line and the laser scanning, direction may also be within the predetermined angle range, but is not limited thereto.

In at least one embodiment of the present disclosure, the extending direction of the data line substantially being parallel to the laser scanning direction may be: an included angle between a straight line of the extending direction of the data line and a straight line of the laser scanning direction is greater than or equal to 0 degree and less than or equal to 20 degrees, but is not limited thereto. The included angle between the straight line where the extending direction of the data line is located and the straight line where the laser scanning direction is located may be: and an acute angle formed by the intersection of a straight line where the extending direction of the data line is located and a straight line where the laser scanning direction is located, but is not limited thereto.

In at least one embodiment of the present disclosure; an included angle between a straight line of the extending direction of the data line and a straight line of the laser scanning direction may be equal to 0 degree, 5 degrees, 10 degrees, 15 degrees, or 20 degrees, but is not limited thereto.

In a specific implementation, a ratio of a length of the first sub-channel portion to a total length of the first channel portion may be within a predetermined ratio range, and the predetermined ratio range may be greater than 0.5.

In at least one embodiment of the present disclosure, a total length of the first channel portion is equal to a sum of a length of the first sub-channel portion and a length of the second sub-channel port on. By setting the predetermined ratio range, the length of the first sub-channel portion can be made larger than that of the second sub-channel portion, so that the grains the first channel portion of the semiconductor material layer pattern of the driving transistor may be arranged relatively orderly in the current conduction direction, thereby improving the field mobility and the output current characteristics of the driving current region.

According to a specific embodiment, the semiconductor material layer pattern of the driving transistor further includes a second conductive portion, the first conductive portion and the second conductive portion are arranged on opposite sides of the first channel portion;

the first sub-channel portion includes a first vertical channel portion, a second vertical channel portion and a third vertical channel portion, the. second sub-channel portion includes a first horizontal channel portion and a second horizontal channel portion, where a first end of the first vertical channel portion is connected to the first conductive portion, a second end of the first vertical channel portion is connected to a first end of the first horizontal channel portion, a second end of the first horizontal channel portion is connected to a first end of the second vertical channel portion, a second end of the second vertical channel portion is connected to a first end of the second horizontal channel portion, a second end of the second horizontal channel portion is connected to a first end of the third vertical channel portion, and a second end of the third vertical channel portion is connected to the second conductive portion.

In at least one embodiment of the disclosure, the first conductive portion may correspond to a source of a driving transistor or a drain of the driving transistor, and the second conductive portion may correspond to a drain of the driving transistor or a source of the driving transistor, hut is not limited thereto.

Optionally, the semiconductor material layer pattern further includes a first horizontal conductive portion and a first vertical conductive portion;

a first end of the first conductive portion is connected to the first end of the first vertical channel portion;

a first end of the first horizontal conductive portion is connected to a second end of the first conductive portion, and a second end of the first horizontal conductive portion is connected to the first vertical conductive portion.

In at least one embodiment of the present disclosure, the first horizontal conductive portion and the first vertical channel portion may be electrically connected through the first conductive portion, and an extending direction of the pattern of the first vertical channel portion and an extending direction of the pattern of the first conductive portion are substantially the same, so that the current conduction may be better performed.

In at least one embodiment of the present disclosure, an extending direction of the pattern of the first vertical channel portion and an extending direction of the pattern of the first conductive portion substantially coinciding may be: an included angle between a straight line of the extending direction of the pattern of the pattern of the first vertical channel portion and a straight line of the extending direction of the pattern of the first conductive portion may be greater than or equal to 0 degree and less than or equal to 20 degrees, but is not limited thereto.

In at least one embodiment of the present disclosure, an included angle between a straight line of an extending direction of the pattern of the first vertical channel portion and a straight line of an extending direction of the pattern of the first conductive portion, may be equal to 0 degree, 5 degrees, 10 degrees, 15 degrees, or 20 degrees, but is not limited thereto.

In at least one embodiment of the present disclosure, an included angle between a straight line of an extending direction of the pattern of the first vertical channel portion and a straight line of an extending direction of the pattern of the first conductive portion may be: and an acute angle formed by intersection of a straight line of the extending direction of the pattern of the first vertical channel portion and a straight line of the extending direction of the pattern of the first conductive portion is not limited to the above.

In a specific implementation, the length of the first vertical conductive portion may be greater than the length of the first horizontal conductive portion, and the length of the first vertical conductive portion may be greater than the length of the first conductive portion, but is not limited thereto:

Optionally, the semiconductor material layer pattern further includes a second horizontal conductive portion and a second vertical conductive portion;

a first end of the second conductive portion is connected to a second end of the third vertical channel portion;

a first end of the second horizontal conductive portion is connected to a second end of the second conductive portion, and a second end of the second horizontal conductive portion is connected to the second vertical conductive portion.

In at least one embodiment of the present disclosure, the second horizontal conductive portion and the third vertical channel portion may be electrically connected through the second conductive portion, and an extending direction of the pattern of the third vertical channel portion and an extending direction of the pattern of the second conductive portion are substantially the same, so that current conduction may be better performed.

In at least one embodiment of the present disclosure, a direction in which the pattern of the third vertical channel portion extends and a direction in which the pattern of the second conductive portion extends substantially coincide may be: an included angle between a straight line of the extending direction of the pattern of the third vertical channel portion and a straight line of the extending direction of the pattern of the second conductive portion may be greater than or equal to 0 degree and less than or equal to 20 degrees, but is not limited thereto.

In at least one embodiment of the present disclosure, an included angle between a straight line of an extending direction of the pattern of the third vertical channel portion and a straight line of an extending direction of the pattern of the second conductive portion may be equal to 0 degree, 5 degrees, 10 degrees, 15 degrees, or 20 degrees, but is not limited thereto.

In at least one embodiment of the present disclosure, an included angle between a straight line of an extending, direction of the pattern of the third vertical channel portion and a straight line of an extending direction of the pattern of the second conductive portion may be: and an acute angle formed by intersection of a straight line of the extending direction of the pattern of the third vertical channel portion and a straight line of the extending direction of the pattern of the second conductive portion, but is not limited thereto.

In a specific implementation, the length of the second vertical conductive portion may be greater than the length of the second horizontal conductive portion, and the length of the second vertical conductive portion may be greater than the length of the second conductive portion.

Optionally, an area of an orthographic projection of the second conductive portion on the base substrate is larger than an area of an orthographic projection of the first conductive portion on the base substrate.

Optionally, the thin film transistor array layer may include a light-emitting control transistor;

a channel portion of the semiconductor material layer of the light-emitting control transistor, the second conductive portion, the first channel portion, and the first conductive portion, which are sequentially arranged in a longitudinal direction.

In at least one embodiment of the present disclosure, "longitudinal" does not necessarily refer to a vertical direction, and the longitudinal direction may be substantially the same as the extending direction of the data line. That is, a straight line along which the longitudinal direction is located may be substantially parallel to a straight line of the extending direction of the data line;

the straight line of the longitudinal direction is substantially parallel to the straight line of the extending direction of the data line means that: an included angle between a straight line of the longitudinal direction and a straight line of the extending direction of the data line is greater than or equal to 0 degree and less than or equal to 20 degrees, but is not limited thereto. For example, the angle between the straight line of the longitudinal direction and the straight line of the extending direction of the data line may he equal to 0 degrees, 5 degrees, 10 degrees, 15 degrees, or 20 degrees.

In at least one embodiment of the present disclosure, an included angle between a straight line of the longitudinal direction and a straight line of the extending direction of the data line may be: the straight line of the longitudinal direction and the straight line of the extending direction of the data line intersect to form an acute angle.

Optionally, the thin film transistor array layer may include a first light-emitting control transistor and a second light-emitting control transistor;

the semiconductor material layer pattern of the first light-emitting control transistor includes a second channel portion, and the semiconductor material layer pattern of the second light-emitting control transistor includes a third channel portion;

the second channel portion, the second conductive portion, the first channel portion and the first conductive portion are sequentially arranged along the longitudinal direction;

the third channel portion, the second conductive portion, the first channel portion and the first conductive portion are sequentially arranged in a longitudinal direction.

Figure 4A:
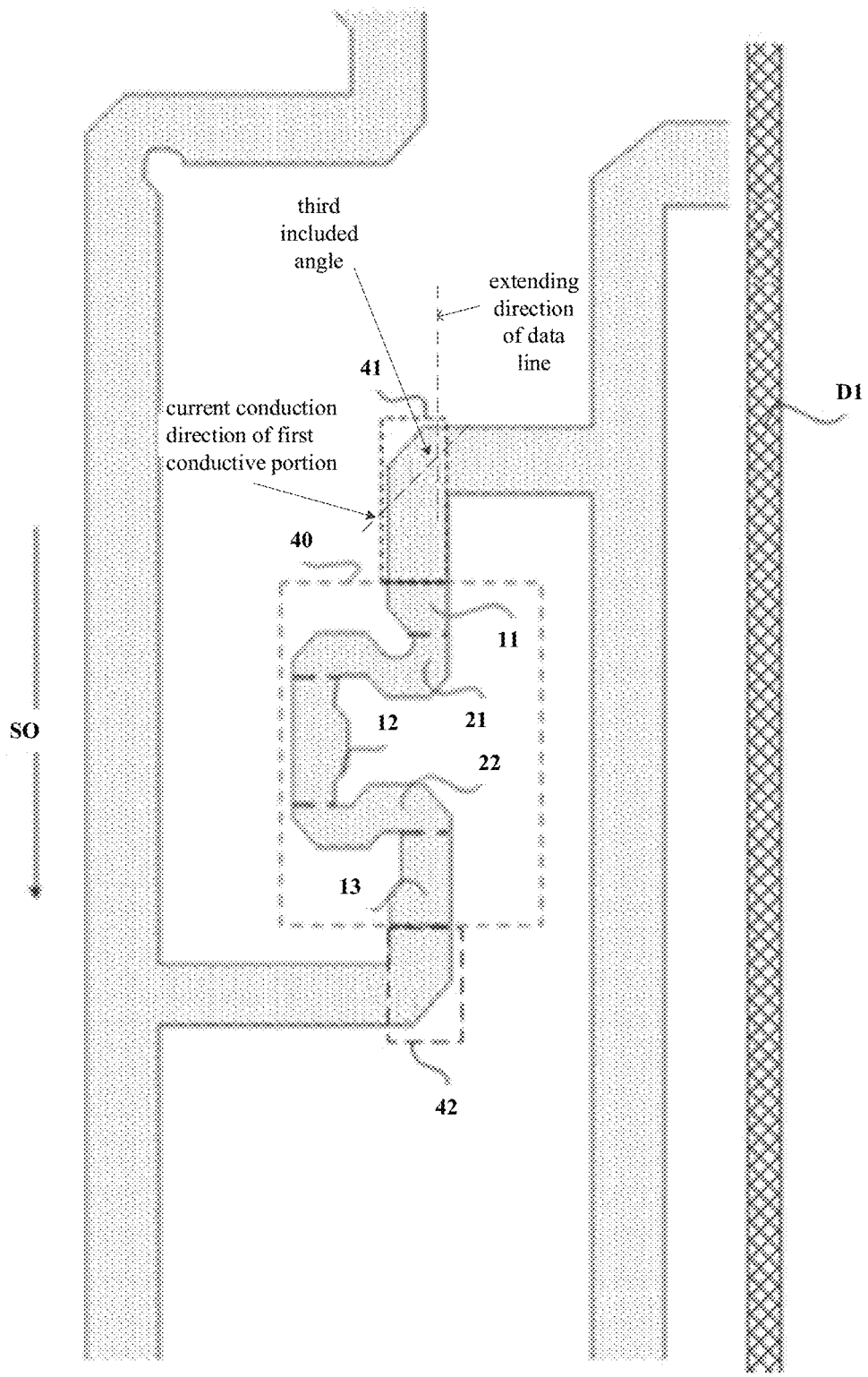
FIG. 4A is a schematic view of a semiconductor material layer pattern of the driving transistor according to at least one embodiment of the present disclosure.

As shown in FIG. 4A, the semiconductor material layer pattern of the driving transistor may include a first channel portion 40 and first conductive portion 41 and second conductive portion 42 disposed on opposite sides of the first channel portion 40.

In at least one embodiment, a first channel portion in the semiconductor material layer pattern of the driving transistor includes a first sub-channel portion and a second sub-channel portion;

as shown in FIG. 4A, the first sub-channel portion may include a first vertical channel portion 11, a second vertical channel portion 12, and a third vertical channel portion 13, and the second sub-channel portion includes a first horizontal channel portion 21 and a second horizontal channel portion 22, the first end of the first vertical channel portion 11 is connected to the first conductive portion 41, the second end of the first vertical channel portion 11 is connected to the first end of the first horizontal channel portion 21, the second end of the first horizontal channel portion 21 is connected to the first end of the second vertical channel portion 12, the second end of the second vertical channel portion 12 is connected to the first end of the second horizontal channel portion 22, the second end of the second horizontal channel portion 22 is connected to the first end of the third vertical channel portion 13, and the second end of the third vertical channel portion 13 is connected to the second conductive portion 42.

In at least one embodiment of the first channel portion of the semiconductor material layer pattern of the driving transistor shown in F1G. 4A, reference numeral S0 denotes a laser scanning direction, reference numeral D1 denotes a data line, and as can be seen from FIG. 4A, the laser scanning direction S0 is parallel to the extending direction of the data line D1.

Also, in at least one embodiment of the first channel portion of the semiconductor material layer pattern of the driving transistor shown in FIG. 4A, the first vertical channel portion 11 is in communication with the first horizontal channel portion 21, the first horizontal channel portion 21 is in communication with the second vertical channel portion 12, the second vertical channel portion 12 is in communication with the second horizontal channel portion 22, and the second horizontal channel portion 22 is in communication with the third vertical channel portion 13.

In at least one embodiment of the first channel portion of the semiconductor material layer pattern of the driving transistor shown in FIG. 4A, the current conduction direction in the first vertical channel portion 11, the current conduction direction in the second vertical channel portion 12, and the current conduction direction in the third vertical channel portion 13 are parallel tote extending direction of the data line D1, the current conduction direction he first horizontal channel portion 21 and the current conduction direction of the second horizontal channel portion 22 are perpendicular to the extending direction of the data line D1, and the current conduction direction of the first conductive portion 41 and the current conduction direction of the second conductive portion 41 are parallel to the extending direction of the data line D1;

a sum of the length of the first vertical channel portion 11, the length of the second vertical channel portion 12 and the length of the third vertical channel portion 13 is a first length, a sum of the length of the first horizontal channel portion 21 and the length of the second horizontal channel portion 22 is a second length and. the first length is greater than the second length.

In at least one embodiment of he first channel portion of the semiconductor material layer pattern of the driving transistor shown in FIG. 4A. an included angle between a straight line of the current conduction direction of the first sub channel portion and a straight line of the extending direction of the data line D1 is 0 degree, an included angle between a straight line of the current conduction direction of the second sub-channel portion and a straight line of the extending direction of the data line D1 is 90 degrees, an included angle between a straight line of the current conduction direction of the first conductive portion 41 an d a straight line of the extending direction of the data line D1 is 0 degree, and an included angle between a straight line of the current Induction direction of the second conductive portion 42 and a straight line of the extending direction of the data line D1 is 0 degree.

According to at least one embodiment of the sent disclosure, the length of the first sub-channel portion is increased and the length of the second sub-channel portion is decreased, so, that the grains of the first channel portion of the semiconductor material layer pattern of the driving, transistor are relatively orderly in the current conduction direction, thereby improving the field mobility and the output current characteristics of the driving current region.

Figure 4B:
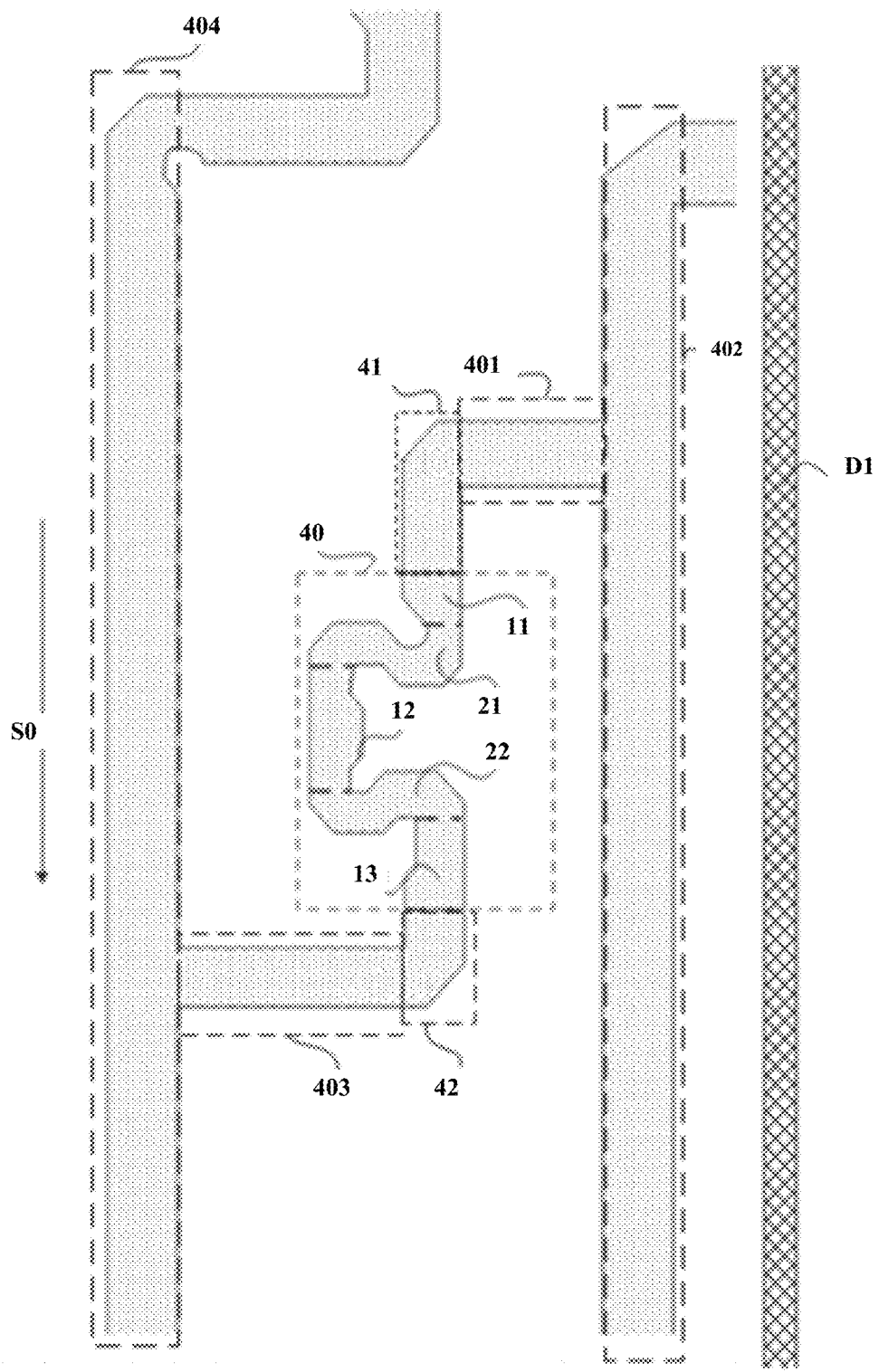
FIG. 4B is a schematic view of a semiconductor material pattern of the driving transistor in at least one embodiment.

As shown in FIG. 4B, on the basis of FIG. 4A, the semiconductor material layer pattern further includes a first horizontal conductive portion 401, a first vertical conductive portion 402, a second horizontal conductive portion 403, and a second vertical conductive portion 404;

a first end of the first conductive portion 41 is connected to a first end of the first vertical channel portion 11;

a first end of the first horizontal conductive portion 401 is connected to a second end of the first conductive portion 41, and a second end of the first horizontal conductive portion 401 is connected to the first vertical conductive portion 402;

a first end of the second conductive portion 42 is connected to a second end of the third vertical channel portion 13;

a first end of the second horizontal conductive portion 403 is connected to a second end of the second conductive portion 42, and a second end of the second horizontal conductive portion 403 is connected to the second vertical conductive portion 404.

Optionally, the length of the first vertical conducting portion 402 is greater than the length of the first horizontal conducting portion 401, the length of the first vertical conducting portion 402 is greater than the length of the first conducting portion 41, the length of the second vertical conducting portion 404 is greater than the length of the second horizontal conducting portion 403, and the length of the second vertical conducting portion 404 is greater than the length of the second conducting portion 42.

Optionally, an area of an orthographic projection of the second conductive portion 42 on the substrate may be larger than an area of an orthographic projection of the first conductive portion 41 on the substrate, but is not limited thereto.

As shows ire FIG. 4B, in at least one embodiment of the present disclosure, the first conductive portion 41 may be a stripe-shaped conductive portion, and an extending direction of the first conductive portion 41 may be substantially the same as an extending direction of the data line D1;

the second conductive portions 42 may be elongated conductive portions, and the extending direction of the second conductive portions 42 may be substantially the same as the extending direction of the data lines D1;

the first vertical channel portion 11 may be a stripe-shaped channel portion, and an extending direction of the first vertical channel portion 11 may be substantially the same as an extending direction of the data line D1;

the second vertical channel portion 12 may be an elongated channel portion, and the extending direction of the second vertical channel portion 12 may be substantially the same as the extending direction of the data line D1;

the third vertical channel portion 13 may be a stripe-shaped channel portion, and an extending direction of the third vertical channel portion 13 may be substantially the same as an extending direction of the data line D1;

the first horizontal channel portion 21 may be a stripe-shaped channel portion, arid an extending direction of the first horizontal channel portion 21 may be substantially perpendicular to an extending direction of the data line D1;

the second horizontal channel portion 22 may be a stripe-shaped channel portion, and an extending direction of the second horizontal channel portion 22 may be substantially perpendicular to an extending direction of the data line D1.

In at least one embodiment of the present disclosure, the extending direction of the first conductive portion 41 and the extending direction of the data line D1 may be substantially the same as: an included angle between a straight line of the extending direction of the first conductive portion 41 and a straight line of the extending direction of the data line D1 is greater than or equal to 0 degree and less than or equal to 20 degrees, but is not limited thereto. For example, an angle between a straight line of the extending direction of the first conductive portion 41 and a straight line of the extending direction of the data line D1 may be equal to 0 degree, 5 degrees, 10 degrees, 15 degrees, or 20 degrees.

An included angle between a straight line of the extending direction of the first conductive portion 41 and a straight line of the extending direction of the data line D1 may be: a acute angle formed by the intersection of the straight line of extending direction of the fir t conductive portion 41 and the straight line of the extending direction of the data line D1, but is not limited thereto.

In at least one embodiment of the present disclosure the extending direction of the second conductive portion 42 and the extending direction of the data line D1 may be substantially the same as: an included angle between a straight line of the extending direction of the second conductive portion 42 and a straight line of the extending direction of the data line D1 is greater than 1, equal to 0 degree and less than or equal to 20 degrees, but is not limited thereto. For example, an angle between a straight line along which the second conductive portion 42 extends and a straight line of the extending direction of the data line D1 may be equal to 0 degree, 5 degrees. 10 degrees, 15 degrees, or 20 degrees.

The included angle between the straight line of the extending direction of the second conductive portion 42 and the straight line of the extending direction of the data line D1 may be: an acute angle formed by the intersection of the straight line of the extending direction of the second conductive portion 42 and the straight line of the extending direction of the data line D1, but is not limited thereto.

In at least one embodiment of the present disclosure, the extending direction of the first vertical channel portion 11 and the extending direction of the data line D1 being substantially the same as: an included angle between a straight line of the extending direction of the first vertical channel portion 11 and a straight line of the extending direction of the data line D1 is greater than or equal to 0 degree and less than or equal to 20 degrees, but is not limited thereto. For example, an angle between a straight line of the extending direction of the first vertical channel portion 11 and a straight line of the extending direction of the data line D1 may be equal to 0 degree, degrees, 10 degrees, 15 degrees, or 20 degrees.

The angle between the straight line of the extending direction of the first vertical channel portion 11 and the straight line of the extending direction of the data line D1 may be: an acute angle formed by the intersection of a straight line of the extending direction of the first vertical channel portion 11 and a straight line of the extending direction of the data line D1, but is not limited thereto.

In at least one embodiment of the present disclosure, the extending direction of the second vertical channel portion 12 and the extending direction of the data line D1 may be substantially the same as: an included angle between a straight line of the extending direction of the second vertical channel portion 12 and a straight line of the extending direction of the data line D1 is greater than or equal to 0 degree and less than or equal to 20 degrees, hut is not limited thereto. For example, an angle between a straight line of the extending direction of the second vertical channel portion 12 is located and a straight line of the extending direction of the data line D1 is located may be equal to 0 degree, 5 degrees, 10 degrees, 15 degrees, or 20 degrees.

The angle between the straight line of the extending direction of the second vertical channel portion 12 and the straight line of the extending direction of the data line D1 may be: the straight line of the extending direction of the second vertical channel portion 12 intersects the straight line of the extending direction of the data line D1, but is not limited thereto.

In at least one embodiment of the present disclosure, the extending direction of the third vertical channel portion 13 and the extending direction of the data line D1 may be substantially the same as: an included angle between a straight line of the extending direction of the third vertical channel portion 13 and a straight line of the extending direction of the data line D1 is greater than or equal to 0 degree and less than or equal to 20 degrees, but is not limited thereto. For example, an angle between a straight line of the extending direction of the third vertical channel portion 13 is located and a straight line of the extending direction of the data line D1 is located may be equal to 0 degree, 5 degrees, 10 degrees, 15 degrees, or 20 degrees.

An angle between a straight line of the extending; direction of the third vertical channel portion 13 and a straight line of the extending direction of the data line D1 may be; an acute angle formed by the intersection of a straight line of the extending direction of the third vertical channel portion 13 and a straight line of the extending direction of the data line D1, but is not limited thereto.

in at least one embodiment of the present disclosure, the extending direction of the first horizontal channel portion 21 and the extending direction of the data. line D1 being substantially perpendicular to each other, may be: an angle between a straight line of the extending direction of the first horizontal channel portion 21 extends and a straight line of the extending direction of the data line D1 is greater than or equal to 70 degrees and less than or equal to 110 degrees, but is not limited thereto, For example, an angle between a straight line of the extending direction of the first, horizontal channel portion 21 is located and a straight line of the extending direction of the data line D1 is located may be equal to 70 degrees, 80 degrees, 90 degrees, 100 degrees, or 110 degrees.

In at least one embodiment of the present disclosure, the extending direction of the second horizontal channel portion 22 and the extending direction of the data line D1 being substantially perpendicular to each other, may be: an angle between a straight line of the extending direction of the second horizontal channel portion 92 and a straight lisle of the extending direction of the data line D1 is greater than or equal to 70 degrees and less than or equal. to 110 degrees, but is not limited thereto. For example, an angle between a straight line of tilt extending direction of the second horizontal channel portion 22 is located and a straight line of the extending direction of the data line Di is located may be equal to 70 degrees, 80 degrees, 90 degrees, 100 degrees, or 110 degrees.

According to another embodiment, the semiconductor material layer pattern of the driving transistor further includes a second conductive portion, the first conductive portion and the second conductive portion are arranged on opposite sides of the first channel portion; the first sub-channel portion includes a first vertical channel portion and a second vertical channel portion, the second sub-channel portion includes a first horizontal channel portion, a second horizontal channel portion, and a third horizontal channel portion, the first end of the first horizontal channel portion is connected to the first conductive portion, the second end of the first horizontal channel portion is connected to the first end of the first vertical channel portion, the second end of the first vertical channel portion is connected to the first end of the second horizontal channel portion, the second end of the second horizontal channel portion is connected to the first end of the second vertical channel portion, the second end of the second vertical channel portion is connected to the first end of the third horizontal channel portion., and the second end of the third horizontal channel portion is connected to the second conductive portion.

Figure 5:
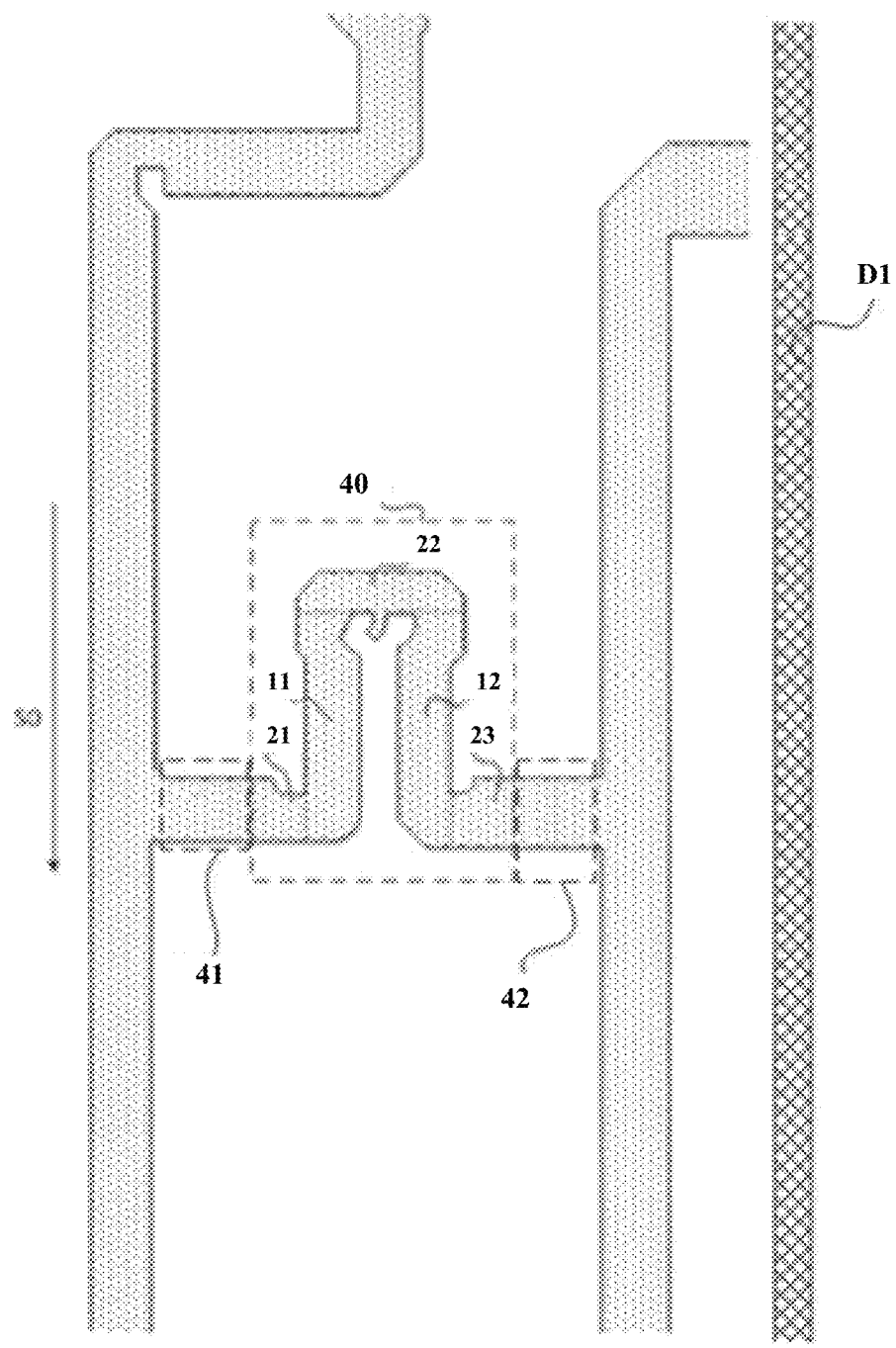
FIG. 5 is a schematic view of a semiconductor material layer pattern of the driving transistor in at least one embodiment.

As shown in FIG. 5, the semiconductor material layer pattern of the driving transistor may include a first channel portion 40 and first and second conductive portions 41 and 42 disposed on opposite sides of the first channel portion 40;

a first channel portion in the semiconductor material layer pattern of the driving transistor includes a first sub-channel portion and a second sub-channel portion;

as shown in FIG. 5, the first sub channel portion includes a first vertical channel portion 11 and a second vertical channel portion 12, and the second sub-channel portion includes a first horizontal channel portion 21, a second horizontal channel portion 22, and a third horizontal channel portion 23, the first end of the first horizontal channel portion 21 is connected to the first conductive portion 41, the second end of the first horizontal channel portion 21 is connected to the first end of the first vertical channel portion 11, the second end of the first vertical channel portion 11 is connected to the first end of the second horizontal channel portion 22, the second end of the second horizontal channel portion 22 is connected to the first end of the second vertical channel portion 12, the second end of the second vertical channel portion 12 is connected to the first end of the third horizontal channel portion 23, and the second end of the third horizontal channel portion 23 is connected to the second conductive portion 42.

In at least one embodiment of the first channel portion of the semiconductor material layer pattern of the driving transistor shown in FIG. 5, reference numeral S0 denotes a laser scanning direction, reference numeral D1 denotes a data line, and as can be seen from FIG. 5, the laser scanning direction S0 is parallel to the extending direction of the data line D1.

Also, in at least one embodiment of the first channel portion of the semiconductor material layer pattern of the driving transistor shown in FIG. 5. the first horizontal channel portion 21 is in communication with the first vertical channel portion 11, the first vertical channel portion 11 is in communication with the second horizontal channel portion 22, the second horizontal channel portion 22 is in communication with the second vertical channel portion 12, and the second vertical channel portion 12 is in communication with the third horizontal channel portion 23.

In at least one embodiment of the first channel portion of the semiconductor material layer pattern of the driving transistor shown in FIG. 5, the current conduction direction in the first vertical channel portion 11 and the current conduction direction in the second vertical channel portion 12 are parallel to the extending direction of the data line D1, and the current conduction direction of the first horizontal channel portion 21, the current conduction direction of the second horizontal channel portion 22, and the current conduction direction of the third horizontal channel portion 23 are perpendicular to the extending, direction of the data line D1;

a sum of the length of the first vertical channel portion 11 and the length of the second vertical channel portion 12 is a third length, a sum of the length of the first horizontal channel portion 21, the length of the second horizontal channel portion 22, and the length of the third horizontal channel portion 23 is a fourth length, and the third length is greater than the fourth length.

Figure 6:
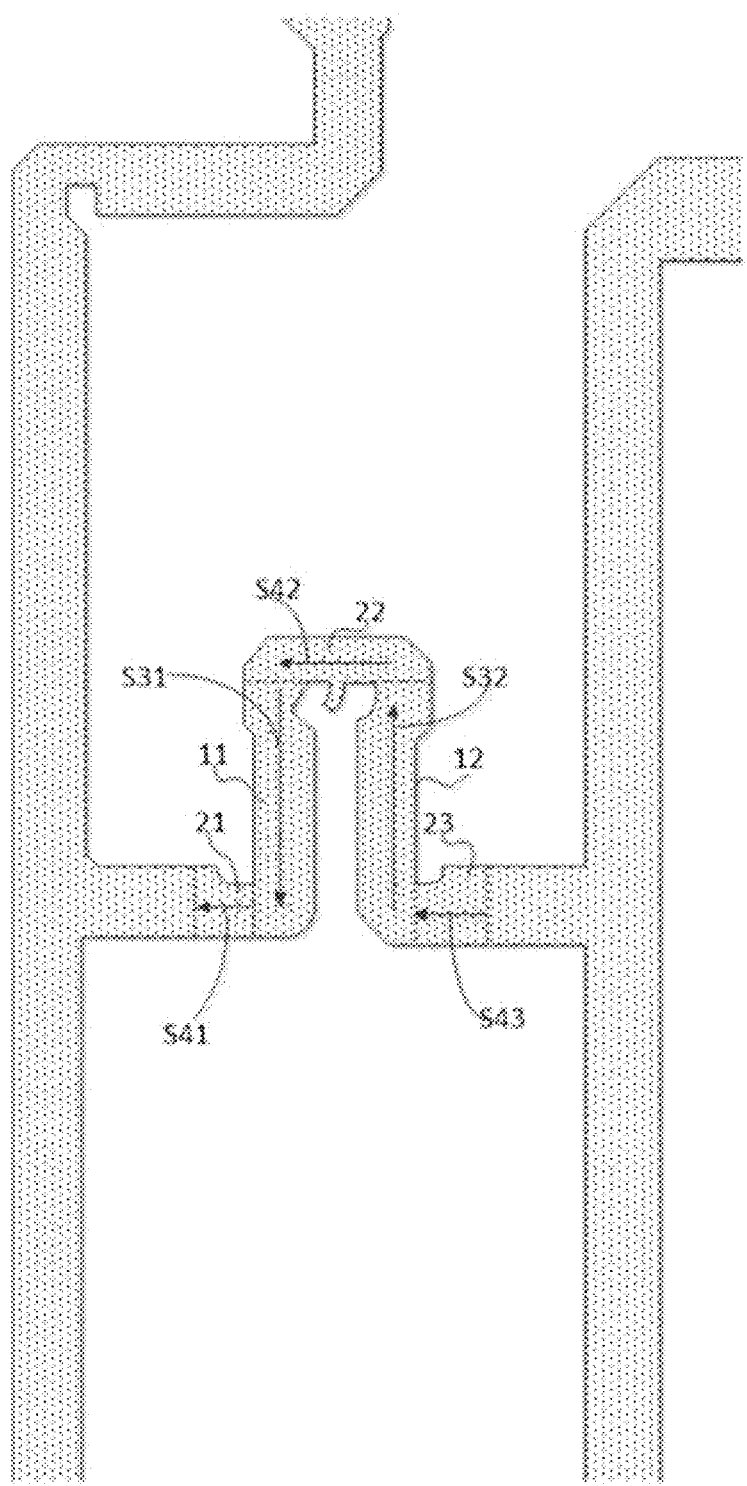
FIG. 6 is a schematic vie of current conduction directions of sub-channel portions of a Semiconductor Material layer pattern of the drive transistor of FIG. 5.

As shown in FIG. 6, the current conduction direction in the first vertical channel portion 11 is a sixth direction S31, the current conduction direction in the second vertical channel portion 12 is a seventh direction S32, the current conduction direction in the first horizontal channel portion 21 is an eighth direction S41, the current conduction direction in the second horizontal channel portion 22 is a ninth direction S42, and the current conduction direction in the third horizontal channel portion 23 is a tenth direction S43;

S31 is parallel to S0, S32 is parallel to S0, S41 is perpendicular to S0, S42 is perpendicular to S0, and S43 is perpendicular to S9; that is, the angle between the straight line of S31 and the straight line of S0 is 0 degree, the angle between the straight line of S32 and the straight line of S0 is 90 degrees, the angle between the straight line of S41 and the straight line of S0 is 90 degrees, and the angle between the straight line of S42 and the straight line of S0 is 90 degrees.

In at least one embodiment of the present disclosure, the transistors and the storage capacitors in the pixel driving circuit may be formed by a thin film transistor array layer; the transistors may include a driving transistor and a switching transistor.

Figure 7:
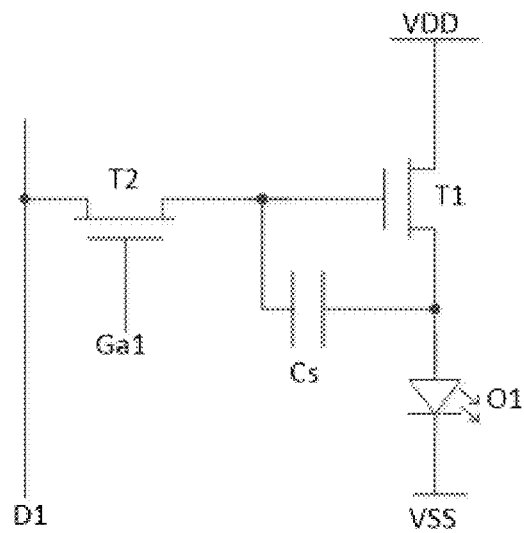
FIG. 7 is a circuit diagram of a pixel driving circuit according to at least one embodiment o the present disclosure.

As shown in FIG. 7, at least one embodiment of the pixel driving circuit may include a driving transistor T1, a switching transistor T2, and a storage capacitor Cs;

a gate electrode of the switching transistor T2 is electrically connected to a first gate line Ga1, a first electrode of the switching transistor T2 is electrically connected to the corresponding column data line D1, and a second electrode of the switching transistor T2 is electrically connected to a gate electrode of the driving transistor T1;

a first plate of the storage capacitor Cs is connected to the gate of the driving transistor T1, and a second plate. of the storage capacitor Cs is electrically connected to the anode of the organic light emitting diode O1; the cathode of the organic light emitting diode O1 is electrically connected with a second voltage terminal VSS;

a first transistor of the driving transistor T1 is electrically connected to the first voltage terminal VDD, and a second transistor of the driving transistor T1 is electrically connected to the anode of O1.

The structure of at least one embodiment of the pixel driving circuit shown in FIG. 7 is only one structure of the pixel driving circuit, and the structure of the pixel driving circuit is not limited. In at least one embodiment of the present disclosure, the driving transistor is a transistor for driving the corresponding light emitting element to emit light.

Figure 8:
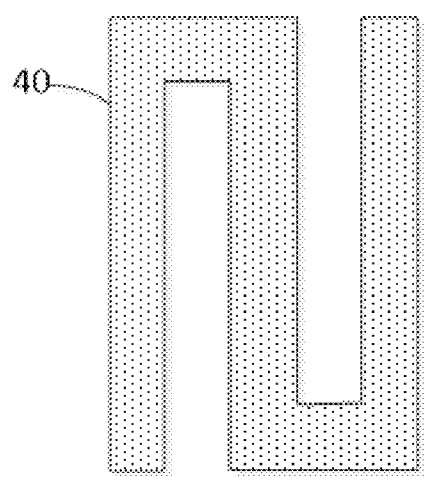
FIG. 8 is a schematic view of the first Channel portion 40 as an "S type" channel portion of the semiconductor material layer pattern of the driving transistor.

In at least one embodiment of the present disclosure, the channel portion in the semiconductor material layer pattern of the driving transistor is designed to be a zigzag shape, such as a zigzag type, as a"S" shape, a "W" zigzag, or a "Z" zigzag, Although the channel portion is described as being zigzag shape, the shape of the first channel portion 40 in the semiconductor material layer pattern of the driving transistor may be "S" shape as shown in FIG. 8 or other broken line type in actual operation, and the shape of the first channel portion 40 is not limited herein.

Figure 9:
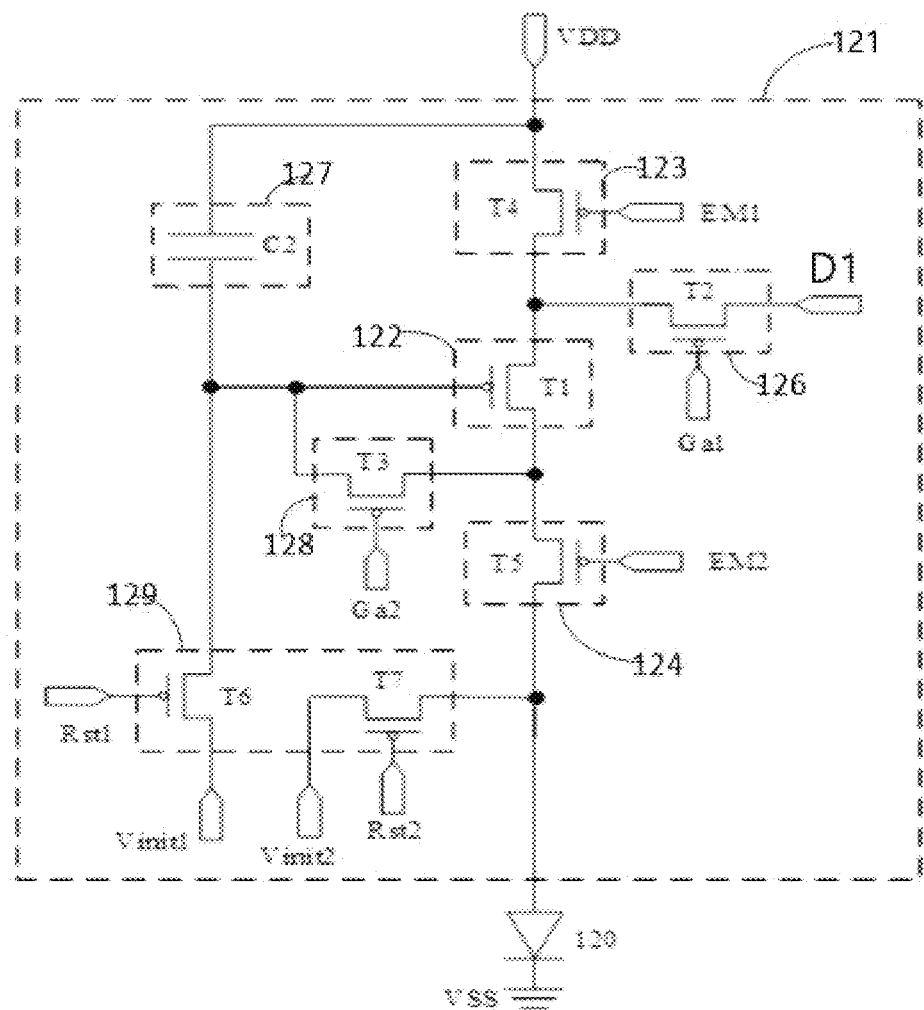
FIG. 9 is a circuit diagram of a pixel circuit 121 to which a driving transistor in a display substrate is applied according to at least one embodiment of the present disclosure.

A circuit diagram of a pixel circuit 121 to which a driving transistor in a display substrate according to at least one embodiment of the present disclosure is applied is shown in FIG. 9.

As shown in FIG. 9, the pixel circuit 121 may include a light emitting element 120, a driving circuit 122, a first light-emitting control circuit 123, and a second light-emitting control circuit 124. The driving circuit 122 includes a control terminal, a first terminal and a second terminal, and is configured to provide a driving current for driving the light emitting element 120 to emit light, for the light emitting element 120. For example, the first light-emitting control circuit 123 is connected to the first terminal of the driving circuit 122 and the first voltage terminal VDD and configured to control connection or disconnection between the driving circuit 122 and the first voltage terminal VDD, and the second light-emitting control circuit 124 is electrically connected to the second terminal of the driving circuit 122 and the first light-emitting voltage applying electrode of the light emitting element 120 and configured to control connection or disconnection between the driving circuit 122 and the light emitting element 120.

As shown in FIG. 9, the pixel circuit 121 further includes a data writing circuit 126 a storage circuit 127, a threshold value compensation circuit 128, and a reset circuit 129. The data writing circuit 126 is electrically connected to the first terminal of the driving circuit 122, and is configured to write the data voltage on the data line D1 into the storage circuit 127 under the control of the scan signal; the memory circuit 127 is electrically connected to the control terminal of the driving circuit 122 and the first voltage terminal VDD, and is configured to store the data voltage; the threshold compensation circuit 128 is electrically connected to the control terminal of the driving circuit 122 and the second terminal of the driving circuit 122, and is configured to perform threshold compensation on the driving circuit 122; the reset circuit 129 is electrically connected to the control terminal of the drive circuit 122 and the first light emitting voltage applying electrode of the light emitting element 120, and is configured to reset the control terminal of the drive circuit 122 and the first light emitting voltage applying electrode of the light emitting element 120 under the control of a reset control signal.

For example, as shown in FIG. 9, the driving circuit 122 includes a driving transistor T1, the control terminal of the driving circuit 122 includes the gate of the driving transistor T1, the first terminal of the driving circuit 122 includes the first transistor of the driving transistor T1, and the second terminal of the driving circuit 122 includes the second transistor of the driving transistor T1.

For example, as shown in FIG. 9, the data writing circuit 126 includes a data writing transistor T2, the memory circuit 127 includes a storage capacitor C2, the threshold compensation circuit 128 includes a threshold compensation transistor T3, the first light-emitting control circuit 123 includes a first light-emitting control transistor T4, the second light-emitting control circuit 124 includes a second light-emitting control transistor T5, the reset circuit 129 includes a first reset transistor T6 and a second reset transistor T7, and the reset control signal may include a first sub reset control signal and a second sub-reset control signal.

For example, as shown in FIG. 9, a first transistor of the data writing transistor T2 is electrically connected with a first transistor of the driving transistor T1, a second transistor)ts the data writing transistor T2 is configured to be electrically connected with the data line D1 to receive a data voltage, and a gate of the data writing transistor T2 is configured to he electrically connected with the first gate line Ga1 to receive a scan signal; a first plate CC1a of the storage capacitor C2 is electrically connected to the first voltage terminal VDD, and a second plate CC2a of the storage capacitor C2 is electrically connected to the gate of the driving transistor T1; a first transistor of the threshold compensating transistor T3 is electrically connected to the second transistor of the driving transistor T1, a second transistor of the: threshold compensating transistor T3 is electrically connected to the gate of the driving transistor T1, and the gate of the threshold compensating transistor T3 is configured to be electrically connected to the second Rate line Ga2 to receive a compensation control signal; a first transistor of the first reset transistor T6 is configured to be electrically connected to the first reset power source terminal Vinit1 to receive the first reset signal, a second transistor of the first reset transistor T6 is electrically connected to the gate of the driving transistor T1, and a grate of the first reset transistor T6 is configured to he electrically connected to the first reset control signal line Rst1 to receive the first sub-reset control signal: a first electrode of the second reset transistor T7 is configured to be electrically connected to the second reset power source terminal Vinit2 to receive the second reset signal, a second electrode of the second reset transistor T7 is electrically connected to the first light-emitting voltage applying electrode of the light emitting element 120, and a gate electrode of the second reset transistor T7 is configured to be electrically connected to the second reset control signal line Rst2 to receive the second sub-reset control signal; a first transistor of the first light-emitting controlling transistor T4 is electrically connected to the first voltage terminal VDD, a second transistor of the first light-emitting controlling transistor T4 is electrically connected to the first transistor of the driving transistor T1, and a gate of the first light-emitting controlling transistor T4 is configured to be electrically connected to the first light-emitting controlling signal line EM1 to receive a first light-emitting controlling signal; a first transistor of the second light-emitting controlling transistor T5 is electrically connected to the second transistor of the driving transistor T1, a second transistor of the second light-emitting controlling transistor T5 is electrically connected to the first light-emitting voltage applying electrode of the light emitting clement 120, and a gate of the second light-emitting controlling transistor T5 is configured to be electrically connected to the second light-emitting control signal line EM2 to receive a second light-emitting control signal; the second light-emitting voltage application electrode of the light-emitting element 120 is electrically connected to a second voltage terminal VSS.

For example, one of the first voltage terminal VDD and the second voltage terminal VSS is a high voltage terminal, and the other is a low voltage terminal. For example, as shown in at least one embodiment, of FIG. 9, the first voltage terminal VDD is a voltage source to output a constant first voltage, and the first voltage is a positive voltage; and the second voltage terminal VSS may be a voltage source to output a constant second voltage, the second voltage being a negative voltage, etc. For example, in some examples, the second voltage terminal VSS may be grounded.

For example, as shown in FIG. 9, the scan signal and the compensation control signal may be the same, that is, the gate electrode of the data writing transistor T2 and the gate electrode of the threshold compensation transistor may be electrically connected to the same signal line, for example, the first gate line Ga1, to receive the same signal (for example, a scan signal), and at this time, the display substrate may not be provided with the second gate line Ga2, reducing the number of signal lines. For another example, the gate electrode of the data writing transistor T2 and the gate electrode of the threshold compensation transistor T3 may be electrically connected to different signal lines, respectively, that is, the gate electrode of the data writing transistor T2 is electrically connected to the first gate line Ga1, the gate electrode of the threshold compensation transistor T3 is electrically connected to the second gate line Ga2, and signals transmitted by the first gate line Ga1 and the second gate line Ga2 are the same.

It should be noted that the scan signal and the compensation control signal may not be the same, so that the gate of the data writing transistor T2 and the threshold compensation transistor T3 may be separately controlled, thereby increasing the flexibility of controlling the pixel circuit.

For example, as shown in FIG. 9, the first and second light-emitting control signals may be the same, that is, the gate electrode of the first light-emitting control transistor T4 and the gate electrode of the second light-emitting control transistor T5 may be electrically connected to the same signal line, for example, the first fight-emitting control signal line EM1, to receive the same signal (for example, the first light-emitting control signal), and at this time, the display substrate may reduce the number of signal lines so as not to provide the second light-emitting control signal line EM2. For another example, the gate of the first light-emitting control transistor T4 and the gate of the second light-emitting control transistor T5 may be electrically connected to different signal lines, respectively, that is, the gate of the first light-emitting control transistor T4 is electrically connected to the first light-emitting control signal line EM1, the gate of the second light-emitting control transistor T5 is electrically connected to the second light-emitting control signal line EM2. and the signals transmitted by the first light-emitting control signal line EM1 and the second light-emitting control signal line EM2 are the same.

It should be noted that, when the first light emitting control transistor T4 and the second light emitting control transistor T5 are different types of transistors, for example, the first light emitting control transistor T4 is a P-type transistor, and the second light emitting control transistor T5 is an N-type transistor, the first light emitting control signal and the second light emitting control signal may also be different, which is not limited in the embodiment of the disclosure.

For example, the first and second sub-reset control signals may be the same, that is, the gate of the first reset transistor T6 and the gate of the second reset transistor T7 may be electrically connected to the same signal line, for example, the first reset control signal line Rst1 to receive the same signal (for example, the first sub-reset control signal), and at this time, the display substrate may not be provided with the second reset control signal line Rst2, reducing the number of signal lines, For another example, the gate of the first reset transistor T6 and the gate of the second reset transistor T7 may be electrically connected to different signal lines, respectively, that is, the gate of the first reset transistor T6 is electrically connected to the first reset control signal line Rst1, the gate of the second reset transistor T7 is electrically connected to the second reset control signal line Rst2, and the signals transmitted by the first reset control signal line Rst1 and the second reset control signal line Rst2 are the same, it should be noted that the first sub-reset control signal and the second sub-reset control signal may be different.

For example, in some examples, the second sub-reset control signal may be the same as the scan signal, i.e., the gate of the second reset transistor T7 may be electrically connected to the first gate line Ga1 to receive the scan signal as the second stir reset control signal.

For example, the first and second reset power supply terminals Vinit1 and Vinit2 may be dc reference voltage terminals to output a constant dc reference voltage. The first and second reset power source terminals Vinit1 and Yinit2 may be high voltage terminals or low voltage terminals as long as they can provide a first and second reset signal to reset the gate of the driving transistor T1 and the first light-emitting voltage applying electrode of the light-emitting element 120, which is not limited by the present disclosure.

It should be noted that the driving circuit 122, the data writing circuit 126, the storage circuit 127, the threshold compensation circuit 128, and the reset circuit 129 in the pixel circuit shown in FIG. 9 are only illustrative, and specific structures of the driving circuit 122, the data writing circuit 126, the storage circuit 127, the threshold compensation circuit 128, and the reset circuit 129 may be set according to actual application requirements, and the embodiment of the present disclosure is not limited thereto.

For example, according to the characteristics of the transistors, the transistors may be divided into N-type transistors and P-type transistors, and for clarity, the embodiments of the present disclosure have been described in detail by taking the transistors P-type transistors (for example, P-type MOS transistors) as an example, that is, in the description of the present disclosure, the driving transistor T1, the data writing transistor T2, the threshold compensation transistor T3, the first light-emitting control transistor T4, the second light-emitting control transistor T5, the first reset transistor T6, and the second reset transistor T7, etc. may all he P-type transistors. However, the transistors in the embodiments of the present disclosure arc not limited to P-type transistors, and one skilled in the art may also implement the functions of one or more transistors in the embodiments of the present disclosure by using N-type transistors (e.g., N-type MOS transistors) according to actual needs.

It should be noted that the transistors used in the embodiments of the present disclosure may be thin film transistors or field effect transistors or other switching devices with the same characteristics, and the thin film transistors may include oxide semiconductor thin film transistors, amorphous silicon thin film transistors or polysilicon thin film transistors, etc. The source, and drain of a transistor may be symmetrical in structure, so that there may be no difference in physical structure, In the embodiments of the present disclosure, in order to distinguish transistors, in addition to a gate electrode as a control electrode, one of the electrodes is directly described as a first electrode, and the other electrode is directly described as a second electrode, so that the first electrode and the second electrode of all or part of the transistors in the embodiments of the present disclosure may be replaced with each other as necessary.

Figure 10A:
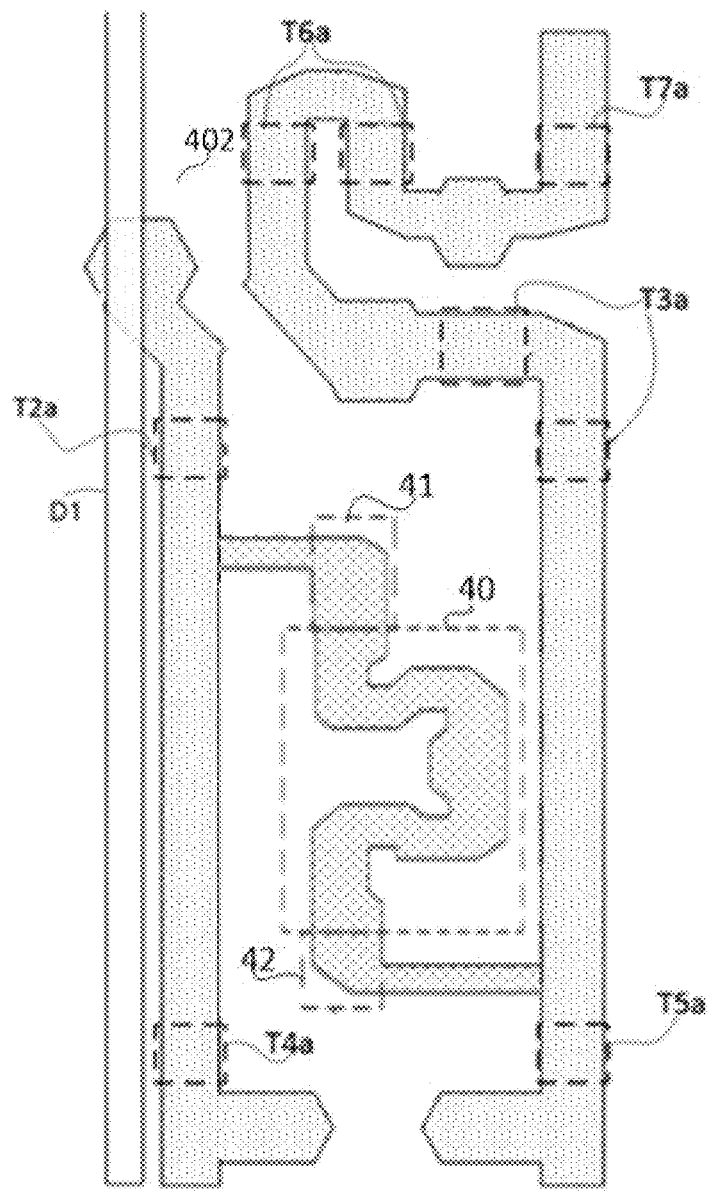
FIG. 10A is a schematic view of a position relationship between a semiconductor material layer pattern and a data line according to at least one embodiment of the present disclosure.

When the pattern of the semiconductor material layer of the driving transistor in the pixel circuit shown in FIG. 9 is as shown in FIG. 4A, the pixel circuit may be formed by a thin film transistor array layer, which may include the semiconductor material layer, a first gate metal layer, a second gate metal layer, and a source-drain metal layer, FIG. 10A shows a schematic view of the positional relationship between the semiconductor material layer pattern and the data line.

As shown in FIG. 10A, reference numeral D1 is a data line in FIG. 9; the other pattern in FIG. 10A is the semiconductor material layer pattern.

In FIG. 10A, reference numeral T6a is a channel portion of T6 in FIG. 9, reference numeral T7a is a channel portion of T7 in FIG. 9, reference numeral T2a is a channel portion of T2 in FIG. 9, reference numeral 40 is a first channel portion of the driving transistor T1 in FIG. 9, reference numeral T3a is a channel portion of T3 in FIG. 9, reference numeral T4a is a second channel portion of T4 in FIG. 9, and reference numeral T5a is a third channel portion of T5 in FIG. 9.

In FIG. 10A, reference numeral 42 denotes a second conductive portion, and reference numeral 41 denotes a first conductive portion, As can be seen from FIG. 10A, the second channel portion T4a, the second conductive portion 42, the first channel portion 40, and the first conductive portion 41 of T4 are arranged upward in this order in the longitudinal direction.

As can be seen from FIG. 10A, the third channel portion T5a, the second conductive portion 42, the first channel portion 40, and the first conductive portion 41 of T5 are arranged upward in this order in the longitudinal direction.

In at least one embodiment of the present disclosure, the "longitudinal direction" may be substantially the same as an extending direction of the data line. That is, a straight line of the longitudinal direction may be substantially parallel to a straight hoe of the extending direction of the data line;

the straight line of the longitudinal direction is substantially parallel to the straight line of the extending direction of the data line means that: an included angle between a straight line of the longitudinal direction and a straight line of the extending direction of the data line is greater than or equal to 0 degree and less than or equal to 20 degrees, but is not limited thereto, For example, the angle between the straight line of the longitudinal direction and the straight line of the extending direction of the data line may be equal to 0 degrees, 5 degrees, 10 degrees, 15 degrees, or 20 degrees.

In at least one embodiment of the present disclosure, an included angle between a straight line of the longitudinal direction and a straight line of the extending direction of the data line may be: the straight line of the longitudinal direction and the straight line of the extending direction of the data line intersect to form an acute angle.

Figure 10B:
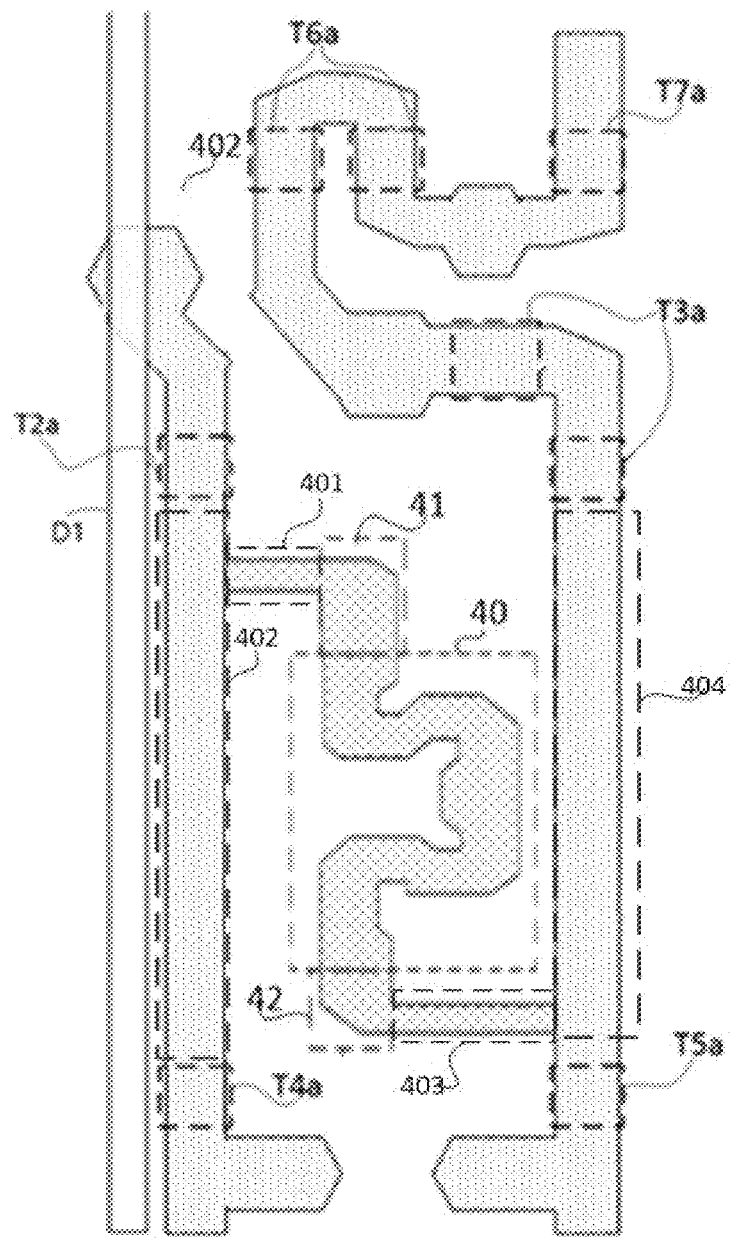
FIG. 10B is a schematic view of a position relationship between a semiconductor material layer pattern and as data line according to at least one embodiment of the present disclosure.

FIG. 10B differs from FIG. 10A in that: a first horizontal conductive portion 401, a first vertical conductive portion 402, a second horizontal conductive portion 403, and a second vertical conductive portion 404 are indicated.

Figure 11:
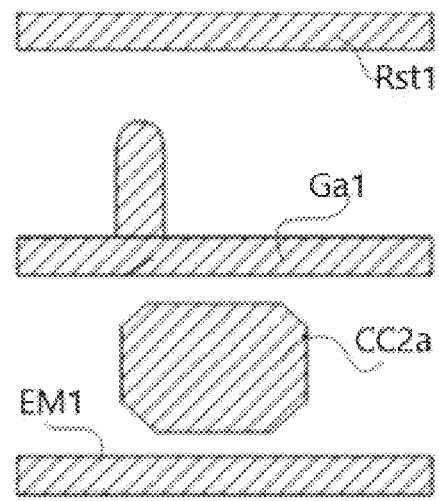
FIG. 11 is a schematic view of a first gate metal layer pattern.

FIG. 11 is a schematic view of a first gate metal layer pattern. In FIG. 11, reference numeral CC2a denotes a second plate of the storage capacitor C2, the second plate CC2a of the storage capacitor C2 is multiplexed as a gate of the. driving transistor T1, reference numeral Rst1 denotes a first reset control signal line, reference numeral Ga1 denotes a first gate line, and reference numeral EM1 denotes a first light-emitting control signal line. In at least one embodiment corresponding to FIG. 11, the first reset control signal line Rst1 and the second reset control signal line are the same signal line, the first gate line Ga1 and the second gate line are the same signal line, and the first light-emitting control signal line EM1 and the second light-emitting control signal line are the same signal line, but the present disclosure, but is not limited thereto.

Figure 12:
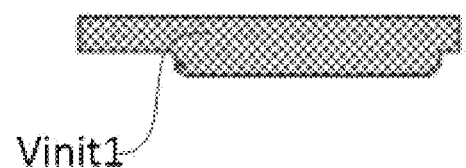
FIG. 12 is a schematic view of a second gate metal layer pattern.
Figure 12:
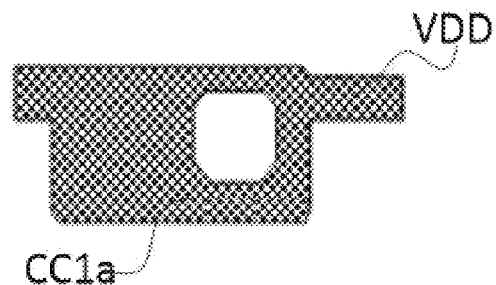

FIG. 12 is a schematic view of a second gate metal pattern. In FIG. 12, reference numeral CC1a is a first plate of the storage capacitor C2, reference numeral VDD is a first voltage terminal, and reference numeral Vinit1 is a first reset power supply terminal; in at least one embodiment corresponding to FIG. 12, the first reset power source terminal Vinit1 and the second reset power source terminal Vinit2 are the same power source terminal, but is not limited thereto.

In at least one embodiment of the present disclosure, an orthogonal projection of the first plate CC1a of the storage capacitor C2 in FIG. 12 on the substrate does not overlap with an orthogonal projection of the second horizontal conductive portion 403 in FIG. 10B on the substrate. In practical implementation, the first plate CC1a of the storage capacitor C2 is electrically connected to the first voltage terminal VDD, and an orthogonal projection CC1a on the substrate does not overlap with an orthogonal projection of the second horizontal conductive portion 403 on the substrate, so that the influence on the potential of the second horizontal conductive portion 403 can be reduced.

Alternatively, the orthographic projection of CC1a on the base substrate may at least partially overlap with the orthographic projection of first conductive portion 41 on the base substrate, the orthographic projection of CC1a on the base substrate may at least partially overlap with the orthographic projection of first horizontal conductive portion 401 on the base substrate, and the orthographic projection of CC1a on the base substrate may at least partially overlap with the orthographic projection of second conductive portion 42 on the base substrate.

Alternatively, the orthographic projection of CC1a on the base substrate does not overlap with the orthographic projection of the second horizontal conductive portion 403 on the base substrate, the orthographic projection of CC1a on the base substrate completely overlaps with the orthographic projection of the first conductive portion 41 on the base substrate, the orthographic projection of CC1a on the base substrate completely overlaps with the orthographic projection of the first horizontal conductive portion 401 on the base substrate, and the orthographic projection of CC1a on the base substrate partially overlaps with the orthographic projection of the second conductive portion 42 on the base substrate. In this embodiment, the influence of the voltage applied to CC1a on the potential of second horizontal conductive portion 403 is reduced on the premise of ensuring the capacitance value.

Figure 13:
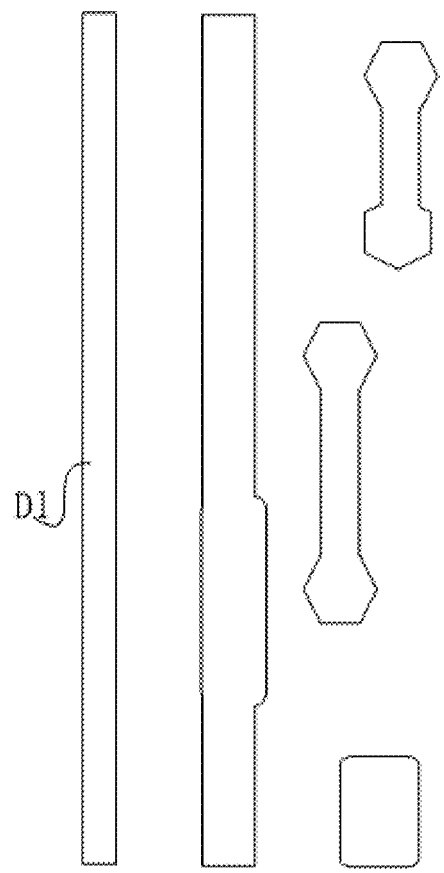
FIG. 13 is a schematic view of a source drain metal layer pattern.

FIG. 13 is a schematic view of a source-drain metal layer pattern. In FIG. 13, reference numeral D1 denotes a data line.

Figure 14:
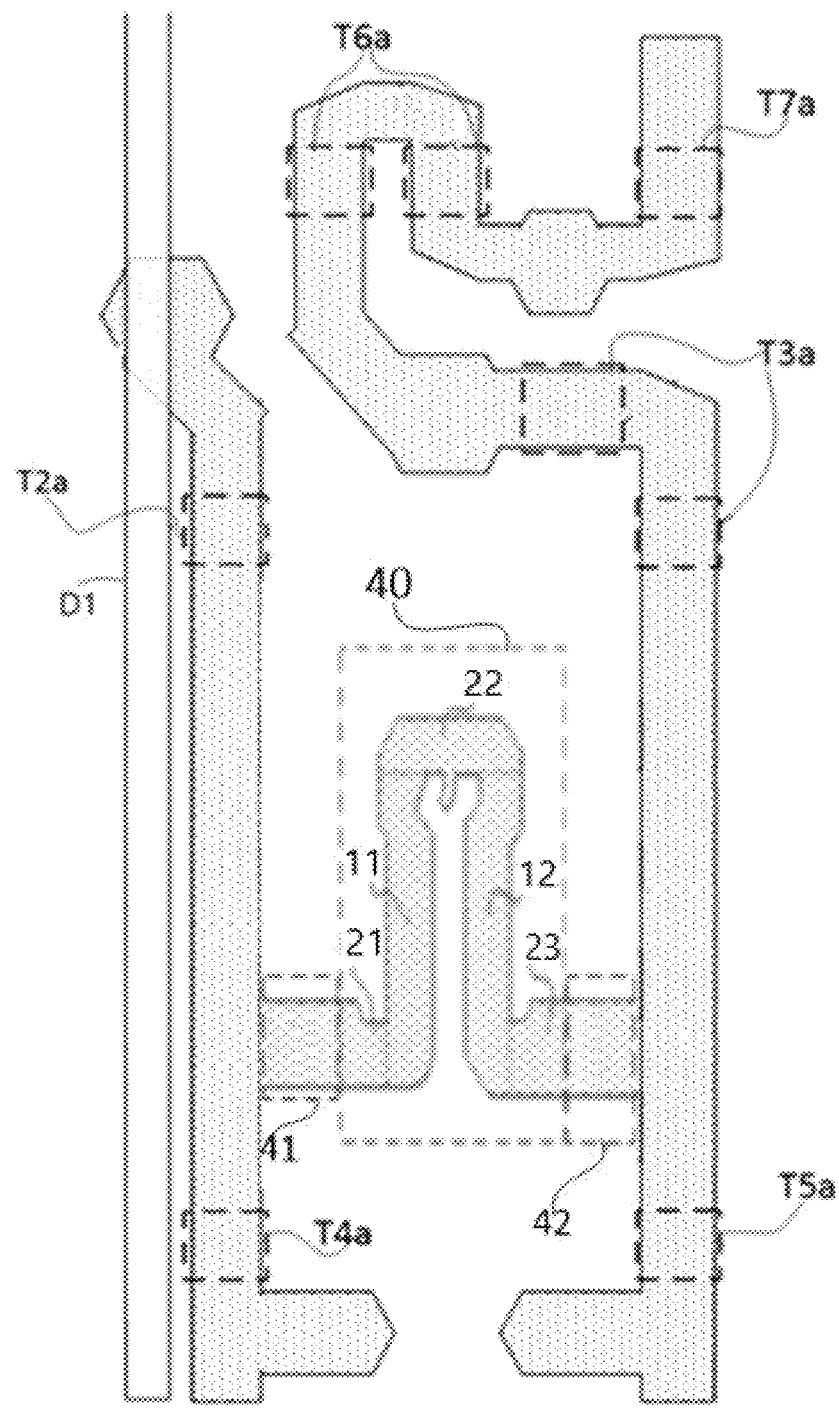
FIG. 14 is a schematic view of a position relationship between a semiconductor material layer pattern and a data line according to at least one embodiment of the present disclosure.

FIG. 14 differs from FIG. 1 in that the first channel portion 40 is different in shape. In FIG. 14, the first channel portion 40 is shaped as in FIG. 5; in FIG. 11, the first channel portion 40 is shaped as in FIG. 4A.

In FIG. 14, reference numeral 11 is a first vertical channel portion, reference numeral 12 is a second vertical channel portion, reference numeral 13 is a third vertical channel portion, reference numeral 21 is a first horizontal channel portion, reference numeral 22 is a second horizontal channel portion, reference numeral 40 is a first channel portion, reference numeral 41 is a first conductive portion, and reference numeral 42 is a second conductive portion; reference numeral T6a is a channel portion of T6 in FIG. 9, reference numeral T7a is a channel portion of T7 in FIG. 9, reference numeral T2a is a channel portion of T2 in FIG. 9, reference numeral T3a is a channel portion of T3 in FIG. 9, reference numeral T4a is a second channel portion of T4 in FIG. 9, and reference numeral T5a is a third channel portion of T5 in FIG. 9.

The method of forming the display substrate according to at least one embodiment of the present disclosure is used for forming the display substrate, and the method of forming the display substrate may include:

forming an amorphous silicon layer on a base substrate;

performing a laser annealing treatment on the amorphous silicon layer to convert the amorphous silicon layer into a polycrystalline silicon layer;

performing a patterning process on the polycrystalline silicon layer to form a semiconductor material layer pattern, arranging a first channel portion of a semiconductor material layer pattern of a driving transistor in a thin film transistor array layer to includes a first sub-channel portion and a second sub-channel portion, arranging a first conductive portion of the semiconductor material layer pattern to be connected to the first sub-channel portion;

an included angle between a straight line where a current conduction direction of the first sub-channel portion is located and a straight line where an extending direction of a data line in the thin film transistor array layer is located is a first included angle;

an included angle between a straight line where a current conduction direction of the second sub-channel portion is located and the straight line where the extending direction of the data line is located is a second included angle;

an included angle between a straight line where a current conduction direction of the first conductive portion is located and, the straight line where the extension direction of the data line is located is a third included angle;

the first included angle is smaller than the second included angle, and the third included angle is smaller than the second included angle.

According to the method of forming a display substrate according, to at least one embodiment of the present disclosure, a channel direction of a driving transistor is adjusted, so that a current conduction direction of a first channel portion in a semiconductor material layer pattern of the driving transistor tends to be parallel to an extending direction of a data line, and the current conduction direction tends to be parallel to a laser scanning direction, so that channel grains of the driving transistor are arranged in order, thereby improving a field mobility of a driving circuit region, reducing a visual defect of displaying Mura (uneven brightness), and improving the quality and yield of the display substrate.

Alternatively, the length of the first sub-channel portion may be greater than the length of the second sub-channel portion.

Optionally, the laser scanning direction is substantially parallel to the current conduction direction of the first channel portion.

In at least one embodiment of the present disclosure, the laser scanning direction being substantially parallel to the current conduction direction of the first channel portion may be: an included angle between a straight line of the laser scanning direction and a straight line of the current conduction direction of the first channel portion is greater than or equal to 0 degree and less than or equal to 20 degrees, but is not limited thereto. The angle between the straight line of the laser scanning direction and the straight line of the current conduction direction of the first channel portion may be: and an acute angle is firmed by intersecting a straight line of the laser scanning direction and a straight line of the current conduction direction of the first channel portion, but the present disclosure is not limited thereto.

In at least one embodiment of the present disclosure, an included angle between a straight line of the laser scanning direction and a straight line of the current conduction direction of the first channel portion may be equal to 0 degree, 5 degrees, 10 degrees, 15 degrees, or 20 degrees, but is not limited thereto.

In at least one embodiment of the present disclosure, the laser annealing treatment on the amorphous silicon layer may be: performing ELA (Excimer Laser Annealing) on the amorphous silicon layer, that is, performing Annealing treatment on the amorphous silicon layer by using an Excimer Laser beam, but is not limited thereto; at this time, the laser scanning direction is also the scanning direction of the excimer laser beam.

In addition, according to at least one embodiment of the present disclosure, the length and the current, conduction direction of each sub-channel portion in the first channel portion in the semiconductor material layer pattern of the driving, transistor are adjusted, so as to satisfy as much as possible that the current conduction direction of the first channel portion in the semiconductor material layer pattern of the driving transistor to be parallel to the ELA laser scanning direction, and the first channel portion is not completely parallel to the ELA laser scanning direction, so that the grains of the first channel portion of the semiconductor material layer pattern of the driving transistor are relatively orderly in the current conduction direction, thereby improving the field mobility and the output current characteristics of the driving current region.

A display panel in at least one embodiment of the present disclosure includes the display substrate hereinabove.

A display device in at least one embodiment of the present disclosure includes the display panel hereinabove.

The display device provided in at least one embodiment of the resent disclosure may be any product or component having a display function, such as a mobile phone, a computer, a television, a display, a notebook computer, a digital photo frame, and a navigator.

While the foregoing is directed to some embodiment of the present disclosure, it will be appreciated that various modifications and adaptations ma be made by those skilled in the art without departing from the principles of the disclosure and should be considered as within the scope of the disclosure.

What is claimed is:

1. A display substrate, comprising a base substrate and a thin film transistor array layer arranged on the base substrate, wherein
    a semiconductor material layer pattern of a driving transistor in the thin film transistor array layer comprises a first channel portion, and the first channel portion comprises a first sub-channel portion and a second sub-channel portion;
    the semiconductor material layer pattern further comprises a first conductive portion connected to the first sub-channel portion;
    an included angle between a straight line where a current conduction direction of the first sub-channel portion is located and a straight line where an extending direction of a data line in the thin film transistor array layer is located is a first included angle;
    an included angle between a straight line where a current conduction direction of the second sub-channel portion is located and the straight line where the extending direction of the data line is located is a second included angle;
    an included angle between a straight line where a current conduction direction of the first conductive portion is located and the straight line where the extending direction of the data line is located is a third included angle;
    the first included angle is smaller than the second included angle, and the third included angle is smaller than the second included angle;

wherein the second sub-channel portion comprises a first horizontal channel portion and a second horizontal channel portion, and both the first horizontal channel portion and the second horizontal channel portion are zigzag.

2. The display substrate according to claim 1, wherein a length of the first sub-channel portion is greater than a length of the second sub-channel portion.

3. The display substrate according to claim 1, wherein the first channel portion is a portion where the semiconductor material layer pattern of the driving transistor overlaps with a gate electrode of the driving transistor.

4. The display substrate according to claim 1, wherein the first channel portion is a zigzag channel portion.

5. The display substrate according to claim 4, wherein the current conduction direction of the first sub-channel portion is substantially parallel to the extending direction of the data line, and the current conduction direction of the second sub-channel portion is substantially perpendicular to the extending direction of the data line.

6. The display substrate according to claim 1, wherein a ratio of a length of the first sub-channel portion to a total length of the first channel portion is greater than 0.5.

7. The display substrate according to claim 4, wherein the semiconductor material layer pattern of the driving transistor further comprises a second conductive portion, the first conductive portion and the second conductive portion are arranged on opposite sides of the first channel portion;
the first sub-channel portion comprises a first vertical channel portion, a second vertical channel portion and a third vertical channel portion, wherein
a first end of the first vertical channel portion is connected to the first conductive portion, a second end of the first vertical channel portion is connected to a first end of the first horizontal channel portion, a second end of the first horizontal channel portion is connected to a first end of the second vertical channel portion, a second end of the second vertical channel portion is connected to a first end of the second horizontal channel portion, a second end of the second horizontal channel portion is connected to a first end of the third vertical channel portion, and a second end of the third vertical channel portion is connected to the second conductive portion.

8. The display substrate according to claim 7, wherein the semiconductor material layer pattern further comprises a first horizontal conductive portion and a first vertical conductive portion;
a first end of the first conductive portion is connected to the first end of the first vertical channel portion;
a first end of the first horizontal conductive portion is connected to a second end of the first conductive portion, and a second end of the first horizontal conductive portion is connected to the first vertical conductive portion.

9. The display substrate according to claim 8, wherein a length of the first vertical conductive portion is greater than a length of the first horizontal conductive portion, the length of the first vertical conductive portion is greater than a length of the first conductive portion.

10. The display substrate according to claim 7, wherein the semiconductor material layer pattern further comprises a second horizontal conductive portion and a second vertical conductive portion;
a first end of the second conductive portion is connected to the second end of the third vertical channel portion;
a first end of the second horizontal conductive portion is connected to a second end of the second conductive portion, and a second end of the second horizontal conductive portion is connected to the second vertical conductive portion.

11. The display substrate according to claim 10, wherein a length of the second vertical conductive portion is greater than a length of the second horizontal conductive portion, the length of the second vertical conductive portion is greater than a length of the second conductive portion.

12. The display substrate according to claim 7, wherein an area of an orthographic projection of the second conductive portion on the substrate is greater than an area of an orthographic projection of the first conductive portion on the substrate.

13. The display substrate according to claim 1, wherein the thin film transistor array layer comprises a first gate metal layer and a semiconductor material layer, the first gate metal layer comprises a gate electrode of the driving transistor, a gate line at a first side of the gate electrode and a light-emitting control signal line at a second side of the gate electrode;
an orthographic projection of the gate line on the substrate, an orthographic projection of the light-emitting control signal line on the substrate and an orthographic projection of the semiconductor material layer on the substrate forms a rectangular region;
a length of the rectangular area is greater than a width of the rectangular area;
the width of the rectangular region is the width of the rectangular region along a direction of the gate line, and the length of the rectangular region is the length of the rectangular region along a direction perpendicular to the gate line.

14. The display substrate according to claim 7, wherein the thin film transistor array layer comprises a light-emitting control transistor;
a channel portion of a semiconductor material layer pattern of the light-emitting control transistor, the second conductive portion, the first channel portion and the first conductive portion are sequentially arranged along a longitudinal direction.

15. The display substrate according to claim 14, wherein the thin film transistor array layer comprises a first light-emitting control transistor and a second light-emitting control transistor;
a semiconductor material layer pattern of the first light-emitting control transistor comprises a second channel portion, the semiconductor material layer pattern of the second light-emitting control transistor comprises a third channel portion;
the second channel portion, the second conductive portion, the first channel portion and the first conductive portion are sequentially arranged along the longitudinal direction;
the third channel portion, the second conductive portion, the first channel portion and the first conductive portion are sequentially arranged in a longitudinal direction.

16. A method of forming the display substrate according to claim 1, comprising:
forming an amorphous silicon layer on a base substrate;
performing a laser annealing treatment on the amorphous silicon layer to convert the amorphous silicon layer into a polycrystalline silicon layer;
performing a patterning process on the polycrystalline silicon layer to form a semiconductor material layer pattern, arranging a first channel portion of a semiconductor material layer pattern of a driving transistor in a thin film transistor array layer to comprises a first sub-channel portion and a second sub-channel portion, arranging a first conductive portion of the semiconductor material layer pattern to be connected to the first sub-channel portion;

an included angle between a straight line where a current conduction direction of the first sub-channel portion is located and a straight line where an extending direction of a data line in the thin film transistor array layer is located is a first included angle;

an included angle between a straight line where a current conduction direction of the second sub-channel portion is located and the straight line where the extending direction of the data line is located is a second included angle;

an included angle between a straight line where a current conduction direction of the first conductive portion is located and the straight line where the extending direction of the data line is located is a third included angle;

the first included angle is smaller than the second included angle, and the third included angle is smaller than the second included angle.

17. The method of forming the display substrate according to claim 16, wherein a length of the first sub-channel portion is greater than a length of the second sub-channel portion.

18. The method of forming the display substrate according to claim 16, wherein a straight line along which a laser scanning direction is located is substantially parallel to the straight line where the current conduction direction of the first sub-channel portion is located.

19. A display panel comprising the display substrate according to claim 1.

20. A display device comprising the display panel according to claim 19.

* * * * *